(12) United States Patent
Watanabe

(10) Patent No.: US 8,441,828 B2
(45) Date of Patent: May 14, 2013

(54) CONTENT ADDRESSABLE MEMORY

(75) Inventor: Naoya Watanabe, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/536,533

(22) Filed: Jun. 28, 2012

(65) Prior Publication Data

US 2012/0262972 A1  Oct. 18, 2012

Related U.S. Application Data

(62) Division of application No. 12/849,384, filed on Aug. 3, 2010.

(30) Foreign Application Priority Data

Aug. 3, 2009 (JP) ................................. 2009-180502

(51) Int. Cl.
 *G11C 15/00* (2006.01)
(52) U.S. Cl.
 USPC .................... 365/49.1; 365/49.11; 365/49.15; 365/49.16; 365/49.17; 365/49.18
(58) Field of Classification Search .................. 365/49.1, 365/49.11, 49.15, 49.16, 49.17, 49.18
 See application file for complete search history.

(56) References Cited

U.S. PATENT DOCUMENTS

| | | | |
|---|---|---|---|
| 5,896,343 A | 4/1999 | Furumochi | |
| 6,603,692 B2 | 8/2003 | Hirota | |
| 6,781,857 B1 | 8/2004 | Lien et al. | |
| 6,795,325 B1 | 9/2004 | Inoue | |
| 7,277,306 B2 | 10/2007 | Noda et al. | |
| 7,619,911 B2 * | 11/2009 | Hanzawa et al. | ............ 365/49.1 |
| 7,661,042 B2 | 2/2010 | Matsuoka et al. | |
| 7,881,090 B2 * | 2/2011 | Park | .......................... 365/49.17 |
| 7,894,227 B2 | 2/2011 | Inoue | |
| 8,164,934 B2 | 4/2012 | Watanabe et al. | |
| 8,169,808 B2 | 5/2012 | Roohparvar | |
| 8,320,148 B1 * | 11/2012 | Derhacobian | .............. 365/49.18 |

FOREIGN PATENT DOCUMENTS

| | | |
|---|---|---|
| JP | 10-255477 | 9/1998 |
| JP | 2001-357675 | 12/2001 |

OTHER PUBLICATIONS

US Office Action issued in corresponding U.S. Appl. No. 12/849,384 dated Jul. 11, 2012.

* cited by examiner

*Primary Examiner* — Trong Phan
(74) *Attorney, Agent, or Firm* — McDermott Will & Emery LLP

(57) ABSTRACT

The present invention provides a content addressable memory capable of higher frequency operation than conventional. When a search enable signal supplied from a search control circuit is asserted, each of search line drivers transfers search data to each CAM cell of a CAM memory array via a search line pair. The search line enable signal is transmitted to the search line drivers via a single control signal line coupled to the search control circuit. The control signal line is coupled to the search line drivers in such a manner that the search line enable signal passes through coupling nodes between the search line drivers and the control signal line in an arrangement order of the search line drivers from the side far away as viewed from match amplifiers.

8 Claims, 25 Drawing Sheets

CONTENT ADDRESSABLE MEMORY

CROSS-REFERENCE TO RELATED APPLICATIONS

This application is a Divisional of U.S. application Ser. No. 12/849,384, filed on Aug. 3, 2010, claiming priority of Japanese Patent Application No. 2009-180502, filed on Aug. 3, 2009, the entire contents of each of which are hereby incorporated by reference.

BACKGROUND OF THE INVENTION

The present invention relates to a content addressable memory (CAM) using semiconductor elements, and particularly to a content addressable memory capable of higher speed operation than conventional.

Generally, with the progress of high integration of a semiconductor memory and a great increase in capacity thereof, a high-speed operation of the semiconductor memory becomes difficult. This is because as one cause thereof, a signal propagation delay occurs due to an increase in wiring capacitance with an increase in the number of memory cells coupled to each wiring.

A technology disclosed in Japanese Unexamined Patent Publication No. Hei 10 (1998)-255477 (Patent document 1) aims to eliminate a propagation delay in the drive control signal outputted from a word line drive circuit. The word line drive circuit of this document includes a signal generation unit, a first driver circuit, a second driver circuit and a speedup driver circuit. The signal generation unit generates a drive signal at a predetermined timing. The first driver circuit drives one end side of a first wiring to which a plurality of controlled circuits are coupled, in response to the drive signal. The second driver circuit drives one end side of a second wiring smaller in drive load than the first wiring in response to the drive signal. The speedup driver circuit has an input coupled to the other end side of the second wiring and the other end side of the first wiring, and an output terminal for driving the other end side of the first wiring when the level of the other end side of the first wiring and the level of the other end side of the second wiring are not coincident with each other.

Japanese Unexamined Patent Publication No. 2001-357675 (Patent document 2) discloses a technology for making access time at reading faster. A semiconductor memory device described in this document includes memory cells arranged in a column direction, a pair of digit lines coupled to each memory cell, and word lines laid so as to intersect with the digit lines respectively and for selecting the respective memory cells. Further, the semiconductor memory device includes a sense amplifier disposed at one ends of the digit lines, a near-end side precharge circuit disposed in the vicinity of the sense amplifier with respect to the digit lines, and a far-end side precharge circuit disposed at the ends of the digit lines on the side opposite to the sense amplifier. Such a semiconductor memory device has a feature that the time at which a precharge operation of the far-end side precharge circuit at a read operation is completed is simultaneous with or earlier than that of the near-end side precharge circuit. Preferably, a signal for selecting each word line lying on the side close to the far-end side precharge circuit at the read operation rises earlier than a signal for selecting each word line lying on the side close to the near-end side precharge circuit.

SUMMARY OF THE INVENTION

This invention is targeted for a content addressable memory provided with a data searching function. A conventional memory outputs data stored in each memory cell, corresponding to an address when the address is inputted. On the other hand, in the content addressable memory, each search data is inputted, and stored data matched with the search data is searched. If the stored data matched with the search data exists, then an address corresponding to the stored data or data related to the address is outputted.

Described concretely, a plurality of memory cells are coupled to a single match line (coincident line) in the content addressable memory. Further, a pair of search lines (retrieval lines) is provided for each memory cell so as to intersect with the match line. Upon a search operation, the match line is precharged to, for example, "1" (H (High) level). Thereafter, search data is transferred via the search lines. When the transferred search data and data stored in the corresponding memory cell in advance match with each other, the match line is maintained in a state of "1". When they do not match with each other, the match line is driven to a state of "0" (L (Low) level). A logic level of the match line is detected by the corresponding match amplifier coupled to the match line.

In order to enable a high-speed operation in the content addressable memory of such a configuration, it is important that the timing for precharging the match line, the timing provided to input the search data to the corresponding memory cell, the timing provided to detect the logic level of the match line, and the like are controlled. In the prior art, however, since the control on these timings is performed by delay stages each using semiconductor elements, it's getting difficult to design the delay stages as the circuit operation becomes faster.

An object of the present invention is to provide a content addressable memory capable of higher frequency operation than conventional.

A content addressable memory according to one embodiment of the present invention comprises match lines, precharge units, a plurality of memory cells respectively arranged along the match lines, match amplifiers and a search data transfer unit. The precharge units are respectively coupled to the match lines and provided to precharge the match lines to a predetermined voltage. Each of the memory cells changes the corresponding match line from a precharge state according to either a match or a mismatch between input search data and data stored in advance upon data searching. The match amplifiers are respectively provided at one ends of the match lines and detect logic levels of the match lines. The search data transfer unit transfers the search data to the memory cells in an arrangement order thereof from the memory cells lying on the side far away from the match amplifiers.

According to the above embodiment, search data are transferred to respective memory cells in an arrangement order of the memory cells from the corresponding memory cells lying on the side far away from match amplifiers. It is thus possible to start the detection of logic levels by the match amplifiers without considering delay times of match lines after the transfer of the search data to the memory cells. As a result, a higher frequency operation than conventional is enabled.

DETAILED DESCRIPTION OF THE PREFERRED EMBODIMENTS

Figure 1:
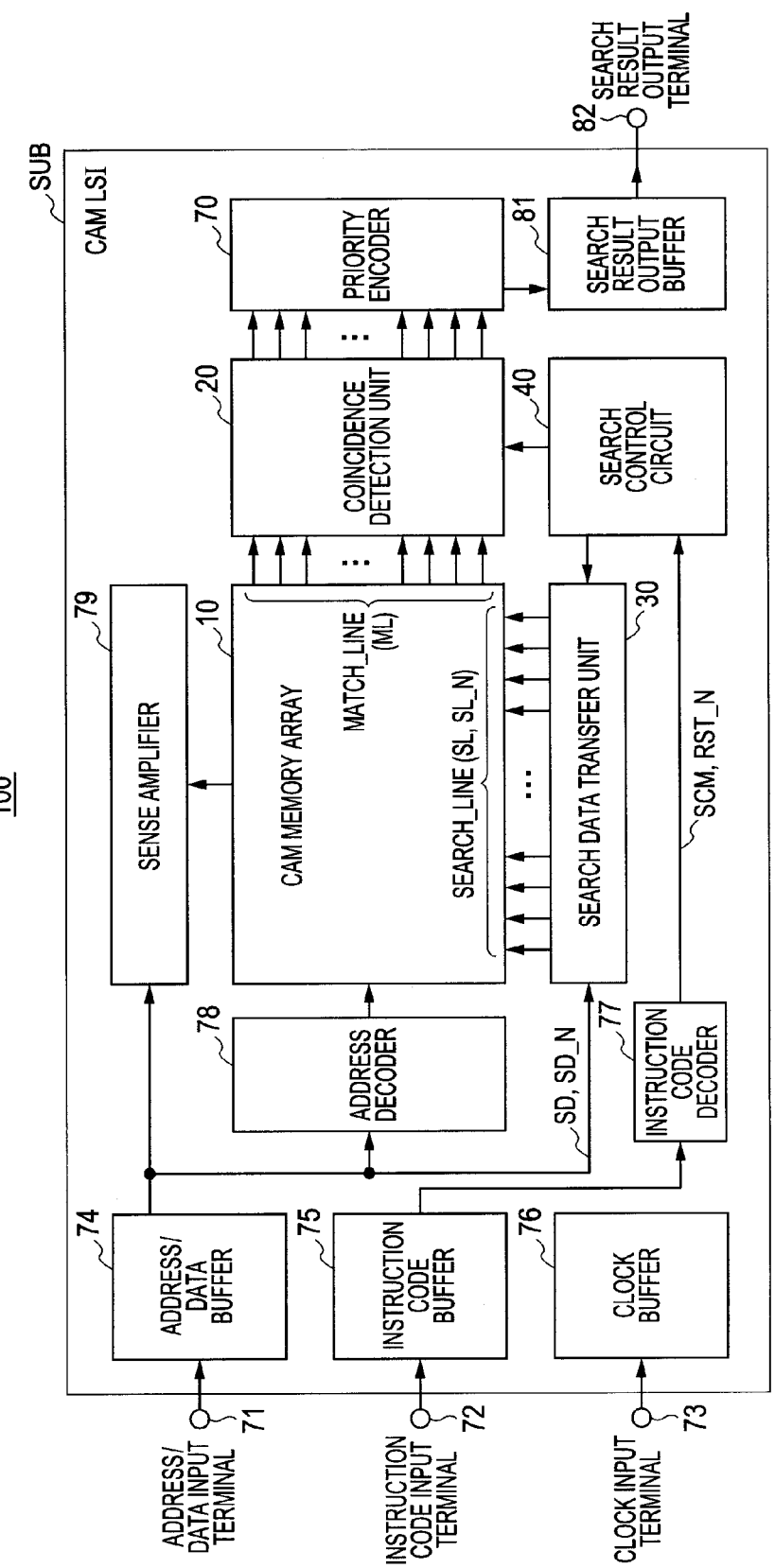
FIG. 1 is a block diagram showing an overall configuration of a content addressable memory 100 according to a first embodiment of the present invention.

Preferred embodiments of the present invention will hereinafter be described in detail with reference to the accompanying drawings. Incidentally, the same reference numerals are respectively attached to the same or corresponding parts, and their description will therefore not be repeated.

First Embodiment

Summary of Overall Configuration and Operation of Content Addressable Memory 100

FIG. 1 is a block diagram showing an overall configuration of a content addressable memory 100 according to a first embodiment of the present invention.

Referring to FIG. 1, the content addressable memory 100 includes a CAM memory array 10 formed over a semiconductor substrate SUB, a match detection unit 20, a search data transfer unit 30, a search control circuit 40 (controller), a priority encoder 70, a search result output buffer 81, an address/data buffer 74, an instruction code buffer 75, an instruction code decoder 77, a clock buffer 76, an address decoder 78 and a sense amplifier 79.

The CAM memory array 10 comprises a plurality of CAM cells (memory cells) arranged in matrix form. Each of the CAM cells has the function of storing one-bit data therein and comparing search data and data stored in advance.

The content addressable memory 100 includes word lines (reference symbol WL of FIG. 3) provided corresponding to respective rows of the CAM memory array 10 and bit line pairs (reference symbols BL and BL_N of FIG. 3) provided corresponding to respective columns of the CAM memory array 10 for normal data writing and reading. Further, the content addressable memory 100 includes match lines (coincident lines) provided corresponding to the respective rows of the CAM memory array 10 and search line pairs SL and SL_N (retrieval line pairs) provided corresponding to the respective columns of the CAM memory array 10 for data searching. Incidentally, in the present specification, _N is attached to the end of each reference symbol where they are placed in a complementary relationship in which logic levels have been inverted.

The match detection unit 20 (match amplifier) detects a logic level ("1" or "0") of each match line ML. It is thus detected whether search data and data stored in advance have matched with each other in each CAM cell coupled to the match line ML.

The search data transfer unit 30 (search line driver) transfers search data to each memory cell of the CAM memory array 10 via the search line pair SL and SL_N upon data searching.

The search control circuit 40 controls operating timings of the search data transfer unit 30 and the match detection unit 20, based on a clock CLK inputted thereto.

The priority encoder 70 outputs each address at which the search data and stored data have matched with each other, as a search result in accordance with a predetermined priority on the basis of the result of detection by the match detection unit 20.

The search result output buffer 81 outputs the search result received from the priority encoder 70 to the outside through a search result output terminal 82.

The address/data buffer 74 outputs each address or data received via an address/data input terminal 71 to the address decoder 78 and the sense amplifier 79. Further, the address/ data buffer 74 receives multibit search data SD and SD_N necessary for data searching therein via the address/data input terminal 71 and outputs the same to the search data transfer unit 30.

The instruction code buffer 75 outputs each instruction code received via an instruction code input terminal 72 to the instruction code decoder 77. The instruction codes includes an instruction code indicative of data writing and an instruction code indicative of a data search, etc.

The instruction code decoder 77 decodes the instruction code received from the instruction code buffer 75 to generate a signal corresponding to the contents of an instruction. When a data search instruction is received, for example, the instruction code buffer 75 activates or asserts a search signal SCM. When a reset instruction is received, the instruction code buffer 75 asserts a reset signal RST.

The address decoder 78 selects a memory cell group target for writing upon data writing, based on the address received from the address/data buffer 74 and selects a memory cell group target for reading upon data reading.

The clock buffer 76 receives a clock from outside via a clock input terminal 73 and outputs it to the respective parts of the content addressable memory 100.

The sense amplifier 79 detects a logic level of a bit line pair to which a read-targeted CAM cell is coupled, upon data reading.

Figure 2:
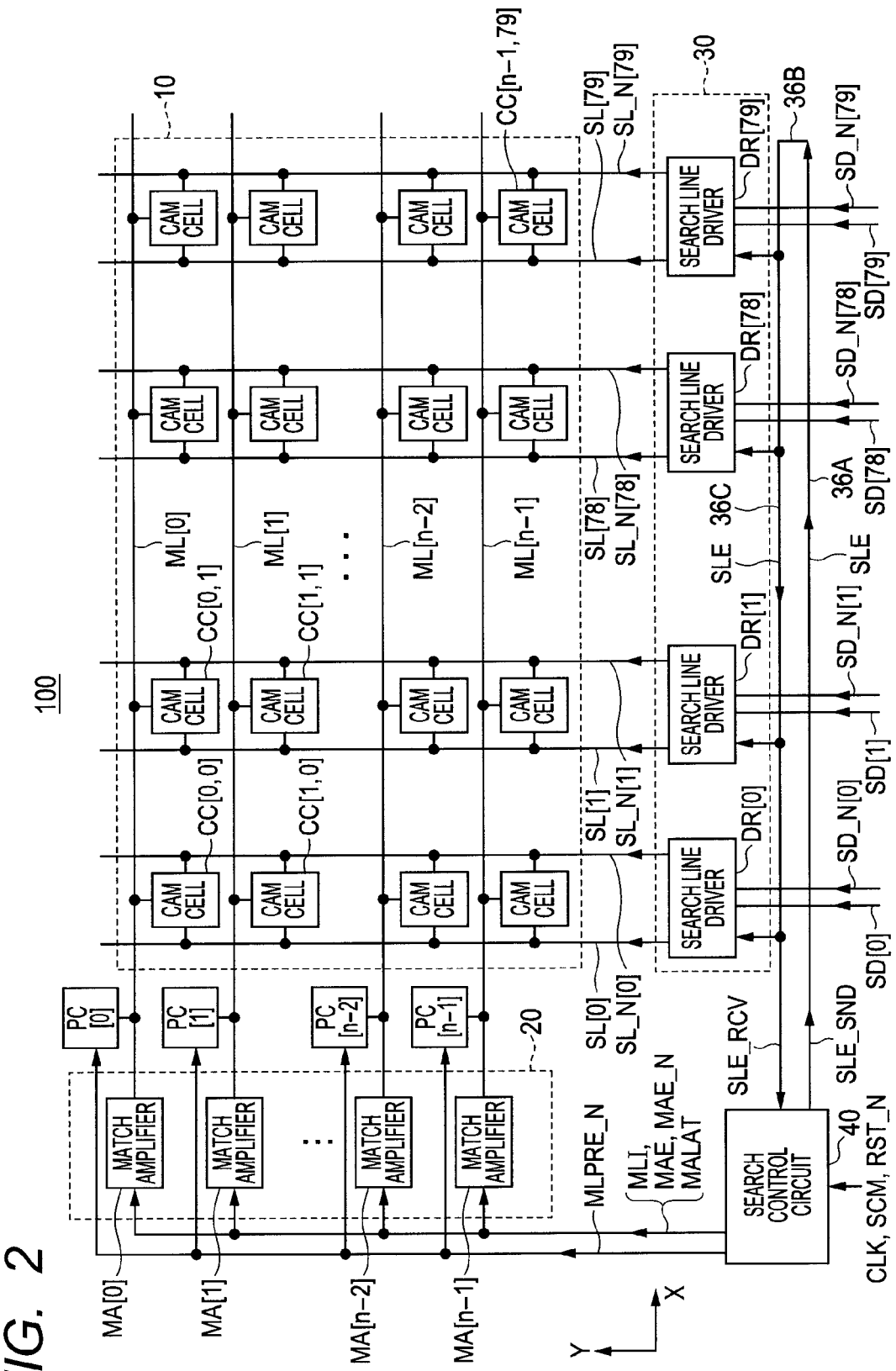
FIG. 2 is a block diagram illustrating the details of a partial configuration of the content addressable memory 100 shown in FIG. 1.

Components related to the data search will be explained below in further detail. FIG. 2 is a block diagram showing a partial configuration of the content addressable memory 100 of FIG. 1 in detail. The CAM memory array 10, the match detection unit 20, the search data transfer unit 30 and the search control circuit 40 are shown in FIG. 2.

The CAM memory array 10 includes a plurality of memory cells (CAM cells) arranged in the form of a matrix with n rows and m columns. In the case of FIG. 2, m=80. CAM cells of ith rows and jth columns (where i: integers of 1 or more to n−1 or less and j: integers of 1 or more to m−1 or less) are described as the corresponding CAM cell CC [i−1, j−1]. The CAM cells are described as CAM cells CC when they are given a generic name or they indicate unspecified ones. Further, the row direction of the CAM memory array 10 is called an X direction, and the column direction thereof is called a Y direction. When the orientations for the X direction are distinguished from each other, they are described with the addition of symbols like a +X direction and a −X direction. The Y direction is also similar to the above.

As shown in FIG. 2, the content addressable memory 100 includes n match lines ML [0] through ML [n−1] which are provided corresponding to the rows of the CAM memory array 10 and extend in the X direction. Further, the content addressable memory 100 includes m pairs of search lines SL [0] and SL_N [0] through SL [m−1] and SL_N [m−1] which are provided corresponding to the columns of the CAM memory array 10 and extend in the Y direction (FIG. 2 describes where m=80). The match lines ML [0] through ML [n−1] and search line pairs SL [0] and SL_N [0] through SL [79] and SL_N [79] are respectively described as match lines ML and search line pairs SL and SL_N where they are given a generic name or they indicate unspecified ones. The CAM cells CC are respectively provided corresponding to points where n match lines ML and m pairs of search line pairs SL and SL_N intersect. The CAM cells CC are coupled to their corresponding match lines ML and search line pairs SL and SL_N.

The content addressable memory 100 further includes precharge units PC [0] through PC [n−1] respectively coupled to the n match lines ML [0] through ML [n−1]. The precharge units PC [0] through PC [n−1] are also respectively described as precharge units PC where they are given a generic name or they indicate unspecified ones. When a match line precharge signal MLPRE_N (third control signal) received from the search control circuit 40 is brought to an active state ("0"), each of the precharge units PC precharges the corresponding match line ML to a predetermined voltage (power supply voltage in FIG. 2). Each precharge unit PC is provided at an end on the −X direction side, of the corresponding match line ML, i.e., in vicinity to the match detection unit 20 (match amplifiers MA [0] through MA [n−1]).

In the content addressable memory, the multibit search data (search words) and the data stored in advance (stored words) are compared every entry comprised of the plural CAM cells CC. In FIG. 2, one entry is comprised of CAM cells CC corresponding to one row (80) coupled to the respective match lines ML. That is, an entry bit width is 80 bits. The search words are inputted to the respective entries of the CAM memory array 10 via search line pairs SL and SL_N corresponding to 80 pairs. The inputted search words and stored words are respectively compared in bit units every CAM cell CC.

A data search procedure will be explained. Firstly, the respective match lines ML are precharged to "1" by the precharge units PC. Next, search data are inputted to the respective CAM cells CC through their corresponding search line pairs SL and SL_N. Each of the CAM cells CC compares the input search data and one-bit data stored in advance. When they are different from each other, the corresponding match line ML being placed in the precharge state is discharged to thereby change the logic level of the corresponding match line ML.

Thus, when the stored data and search data are brought into match (HIT) even in the case of any of the CAM cells CC respectively coupled to the match lines ML, i.e., when the search word and the stored word have matched with each other, the logic level of the corresponding match line ML is maintained at "1". When the stored data and search data are brought into mismatch (MISS) with respect to at least one CAM cell CC coupled to the match lines ML, i.e., when the search word and stored word do not match with each other, a precharged electric charge is discharged so that the logic level of the corresponding match line ML is brought to "0".

Incidentally, there are considered, as data search procedures, various procedures such as a method for precharging each match line to "0" and charging it to "1" when stored data and search data are brought into HIT, a method for precharging each match line to "1" and charging it to "0" when stored data and search data are brought into HIT, etc. The present application is not limited particularly to the data search procedure.

The match detection unit 20 includes n match amplifiers MA [0] through MA [n−1] respectively corresponding to the n match lines ML. The match amplifiers MA [0] through MA [n−1] are respectively described below as match amplifiers MA when they are given a generic name or when they designate unspecified ones. The respective match amplifiers MA are coupled to ends on the −X-direction side, of their corresponding match lines ML.

Each of the match amplifiers MA detects the logic level ("1" or "0") of the corresponding match line ML. As described in FIG. 3, the match amplifier MA compares the voltage of the corresponding match line ML and a reference voltage applied to a reference line (ML_REF of FIG. 3) to thereby detect the logic level of the match line ML. The operation of each match amplifier MA is controlled by match amplifier control signals MLI, MAE and MALAT (second control signal) outputted from the search control signal 40.

The search data transfer unit 30 includes, in total, m search line drivers DR [0] through DR [m−1] (m=80 in FIG. 2) respectively corresponding to the search line pairs SL [0] and SL_N [0] through SL [m−1] and SL_N [m−1] corresponding to the m pairs. The search line drivers DR [0] through DR [79] are respectively described as search line drivers DR where they are given a generic name or when they indicate unspecified ones. Each search line driver DR is coupled to its corresponding end on the −Y-direction side, of the corresponding search line pair SL and SL_N.

As shown in FIG. 2, the ith (where i: integer of 1 or more to m or less) search line driver DR [i−1] receives each individual search data SD [i−1] and SD_N [i−1] and a common search line enable signal SLE (first control signal). The search data SD [i−1] and SD_N [i−1] are complementary data in which when one thereof is "1", the other thereof is brought to "0", which is supplied from the address/data buffer 74 shown in FIG. 1. The search line enable signal SLE is supplied from the search control circuit 40 through a single control signal line 36 (36A, 36B and 36C). The search line driver DR [i−1] transfers the search data SD [i−1] and SD_N [i−1] to the corresponding search line pair SL [i−1] and SL_N [i−1] when the search line enable signal SLE is in an active state ("1"). Incidentally, the search data SD [0] and SD_N [0] through SD [m−1] and SD_N [m−1] are also described as search data SD and SD_N where they are given a generic name or when they indicate unspecified ones.

[Details of Match Amplifiers and Search Line Drivers, etc.]

A description will hereinafter be made in further detail of the configurations and operations of the precharge units PC, CAM cells, match amplifiers MA and search line drivers DR.

Figure 3:
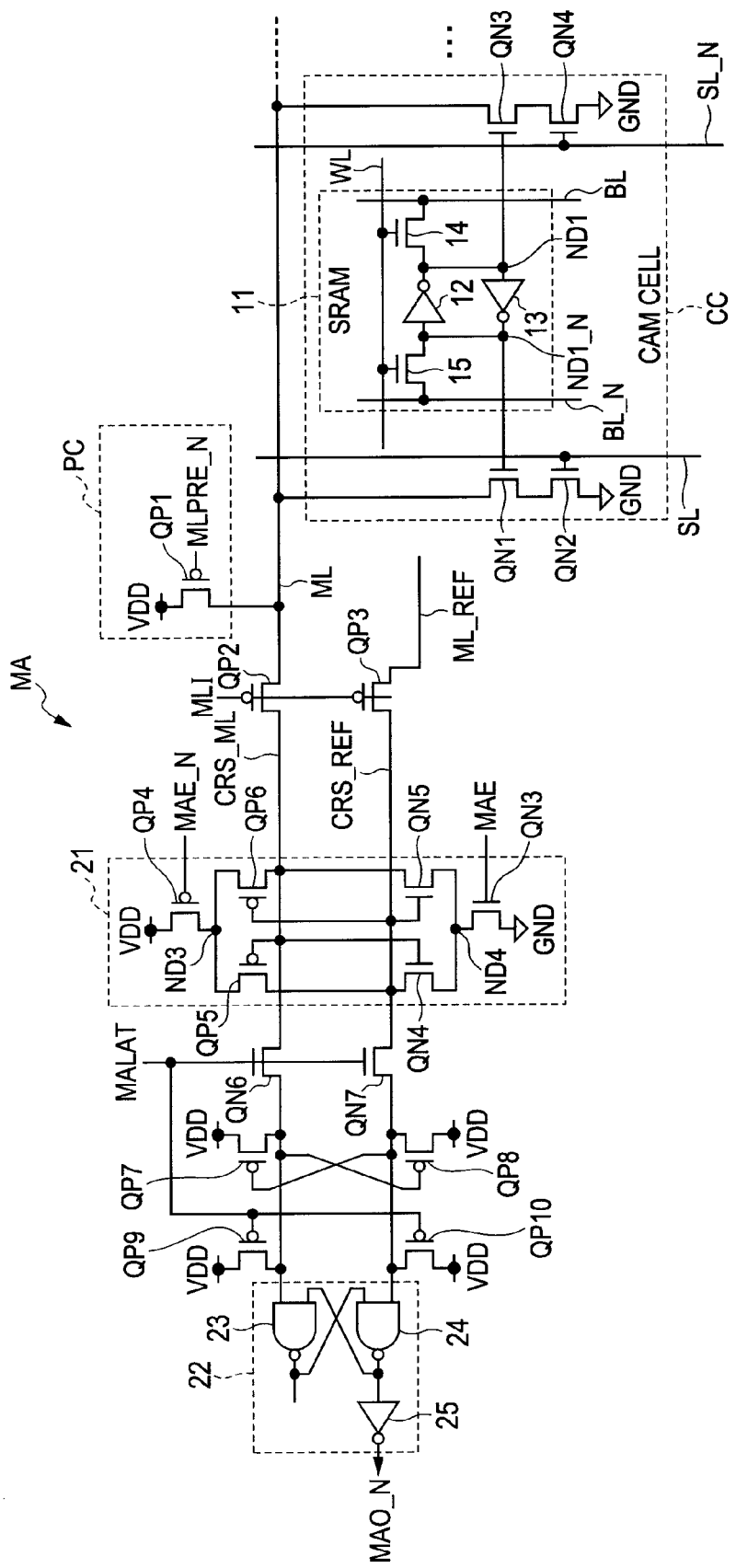
FIG. 3 is a circuit diagram depicting configurations of a precharge unit PC, a CAM cell CC and a match amplifier MA shown in FIG. 2.

FIG. 3 is a circuit diagram showing the configurations of the precharge unit PC, CAM cell CC and match amplifier MA shown in FIG. 2.

(1. Precharge Unit PC)

Referring to FIG. 3, each of the precharge units PC includes a PMOS (P-channel Metal Oxide Semiconductor) transistor QP1. A drain of the PMOS trnasistor QP1 is coupled to its corresponding match line ML, a source thereof is coupled to a power supply node VDD and a gate thereof is inputted with a match line precharge signal MLPRE_N. When the match line precharge signal MLPRE_N is asserted ("0"), the PMOS transistor QP1 is brought into conduction so that a power supply voltage is applied to the match line ML.

(2. Configuration of CAM Cell)

The CAM cell CC includes a SRAM (Static Random Access Memory) cell 11 which stores data therein, and NMOS (N-channel Metal Oxide Semiconductor) transistors QN1 through QN4.

The SRAM cell 11 includes a flip-flop comprised of inverters 12 and 13 and NMOS transistors 14 and 15 for the input/output of data. Respective output nodes of the inverters 12 and 13 are coupled to the other input nodes. The output nodes of the inverters 12 and 13 are used as storage nodes ND1 and ND1_N for retaining data. The data stored at the storage nodes ND1 and ND1_N are complementary data in which when one thereof is "1", the other thereof is brought to "0".

The storage node ND1 is coupled to its corresponding bit line BL via the NMOS transistor 14. The storage node ND1_N is coupled to its corresponding bit line BL_N via the NMOS transistor 15. Gate electrodes of the NMOS transistors 14 and 15 are coupled to their corresponding word line WL. The word line WL and bit line pair BL and BL_N are used upon normal data wiring and reading.

The NMOS transistors QN1 and QN2 are coupled in series between the match line ML and a ground node GND in this order. A gate of the NMOS transistor QN1 is coupled to the storage node ND1_N, and a gate of the NMOS transistor QN2 is coupled to its corresponding search line SL.

The NMOS transistors QN3 and QN4 are coupled in series between the match line ML and the ground node GND in this order. A gate of the NMOS transistor QN3 is coupled to the storage node ND1, and a gate of the NMOS transistor QN4 is coupled to its corresponding search line SL_N.

Thus, when the storage node ND1 is "1" (the storage node ND1_N is "0") and the search line SL is "1" (the search line SL_N is "0") upon data searching (HIT), the NMOS transistors QN2 and QN3 are respectively brought to a conducting state and the NMOS transistors QN1 and QN4 are respectively brought to a non-conducting state. Since the match line ML and the ground node GND are in a non-coupled state in this case, the voltage of the precharged match line ML is maintained.

When the storage node ND1 is "1" and the search line SL is "0" upon data searching (MISS), the NMOS transistors QN3 and QN4 are respectively brought into conduction, and the NMOS transistors QN1 and QN2 are respectively brought into non-conduction. In this case, the match line ML and the ground node GND are coupled to each other through the NMOS transistors QN3 and QN4. The electric charge of the precharged match line ML is discharged via this conductive path.

When the storage node ND1 is "0" and the search line SL is "0" upon data searching (HIT), the NMOS transistors QN1 and QN4 are respectively brought to a conducting state, and the NMOS transistors QN2 and QN3 are respectively brought to a non-conducting state. Since the match line ML and the ground node GND are in the non-coupled state in this case, the voltage of the precharged match line ML is maintained.

When the storage node ND1 is "0" and the search line SL is "1" upon data searching (MISS), the NMOS transistors QN1 and QN2 are respectively brought to the conducting state, and the NMSO transistors QN3 and QN4 are respectively brought to the non-conducting state. In this case, the match line ML and the ground node GND are coupled to each other through the NMOS transistors QN1 and QN2. The electric charge of the precharged match line ML is discharged via this conductive path.

(3. Configuration of Match Amplifier)

As shown in FIG. 3, the match amplifier MA includes transfer gates QP2 and QP3 being PMOS transistors, a comparison circuit 21, transfer gates QN6 and QN7 being NMOS transistors, a latch circuit 22 and PMOS transistors QP7 through QP10. The match amplifier MA is supplied with the match amplifier control signals MLI, MAE, MAE_N and MALAT from the search control circuit 40 of FIG. 2.

The transfer gate QP2 performs switching to a coupled state or a non-coupled state between the match line ML and a signal line CRS_ML lying inside the match amplifier MA. The transfer gate QP3 performs switching to a coupled state or a non-coupled state between the reference line ML_REF and a signal line CRS_REF lying inside the match amplifier MA. When the voltage of the match line ML and the reference voltage of the reference line ML_REF are compared by the match amplifier MA, the match amplifier control signal MLI inputted to gate electrodes of the transfer gates QP2 and QP3 is asserted ("1"). Thus, since the transfer gates QP2 and QP3 are respectively brought to a non-conducting state, it is possible to prevent them from being affected by the capacitance of the match line ML.

The comparison circuit 21 compares the voltage of the match line ML and the reference voltage of the reference line ML_REF both transferred via the transfer gates QP2 and QP3. As shown in FIG. 3, the comparison circuit 21 includes PMOS transistors QP4 through QP6 and NMOS transistors QN3 through QN5. A description will be made of coupling between these transistors. The PMOS transistor QP4 is coupled between the power supply node VDD and a node ND3, and the NMOS transistor QN3 is coupled between the ground node GND and a node ND4. The PMOS transistor QP5 is coupled between the node ND3 and the signal line CRS_REF, and the PMOS transistor QP6 is coupled between the node ND3 and the signal line CRS_ML. The NMOS transistor QN4 is coupled between the node ND4 and the signal line CRS_REF, and the NMOS transistor QN5 is coupled between the node ND4 and the signal line CRS_ML.

Upon the operation of the match amplifier MA, the match amplifier control signal MAE applied to a gate electrode of the NMOS transistor QN3 is asserted to "1", and the match amplifier control signal MAE_N applied to a gate electrode of the PMOS transistor QP4 is asserted to "0". Thus, when the voltage of the match line ML is higher than that of the reference line ML_REF, the voltage of the signal line CRS_ML is driven to the power supply voltage and the voltage of the signal line CRS_REF is driven to a ground voltage. When the voltage of the match line ML is lower than that of the reference line ML_REF in reverse, the voltage of the signal line CRS_ML is driven to the ground voltage and the voltage of the signal line CRS_REF is driven to the power supply voltage.

The transfer gates QN6 and QN7 are provided to perform switching to a coupled state or a non-coupled state between the comparison circuit 21 and the latch circuit 22. Gate electrodes of the transfer gates QN6 and QN7 are inputted with the match amplifier control signal MALAT. When the match amplifier control signal MALAT is active ("1"), the transfer gates QN6 and QN7 are brought into conduction. When the match amplifier control signal MALAT is inactive ("0"), the transfer gates QN6 and QN7 are respectively brought to a non-conducting state.

The latch circuit 22 is of an RS (Reset-Set) latch circuit, which includes NAND circuits 23 and 24 and an inverter circuit 25. A first input node of the NAND circuit 23 is coupled to the signal line CRS_ML through the transfer gate QN6, and a second input node thereof is coupled to an output node of the NAND circuit 24. A first input node of the NAND circuit 24 is coupled to the signal line CRS_REF through the transfer gate QN7, and a second input node thereof is coupled to an output node of the NAND circuit 23. The inverter circuit 25 outputs an inverted signal of an output of the NAND circuit 24 as an output signal MAO_N of the match amplifier MA.

The PMOS transistors QP7 and QP8 are provided to compensate for a voltage reduction due to the transfer gates QN6 and QN7. As shown in FIG. 3, a source of the PMOS transistor QP7 is coupled to the power supply node VDD, a drain thereof is coupled to the first input node of the NAND circuit 23, and a gate thereof is coupled to the first input node of the NAND circuit 24. A source of the PMOS transistor QP8 is coupled to the power supply node VDD, a drain thereof is coupled to the first input node of the NAND circuit 24, and a gate thereof is coupled to the first input node of the NAND circuit 23.

Assume that as a result of the match line ML and the reference line ML_REF being driven by the comparison circuit 21, the voltage of the signal line CRS_ML becomes equal to the power supply voltage and the voltage of the signal line CRS_REF becomes equal to the ground voltage. In this case, the voltage transferred to the NAND circuit 23 by the transfer gate QN6 is made lower than the power supply voltage by the threshold voltage of the NMOS transistor. Since the PMOS transistor QP7 is brought into conduction by the provision of the PMOS transistors QP7 and QP8 as shown in FIG. 3, the voltage of the first input node of the NAND circuit 23 can be made equal to the power supply voltage.

The PMOS transistors QP9 and QP10 are provided to control an operating state of the latch circuit 22. As shown in FIG. 3, the PMOS transistor QP9 is coupled between the power supply node VDD and the first input node of the NAND circuit 23, and the PMOS transistor QP10 is coupled between the power supply node VDD and the first input node of the NAND circuit 24. The match amplifier control signal MALAT is inputted to gates of the PMOS transistors QP9 and QP10.

Since the PMOS transistors QP9 and QP10 are made conductive where the match amplifier control signal MALAT is in an inactive state ("0"), the inputs of the latch circuit 22 are both brought to "1". At this time, the latch circuit 22 holds its original internal state. Since the PMOS transistors QP9 and QP10 are made non-conductive where the match amplifier control signal MALAT is in an active state ("1"), the latch circuit 22 outputs a value corresponding to the output result of the comparison circuit 21.

(4. Configuration of Search Line Driver)

Figure 4:
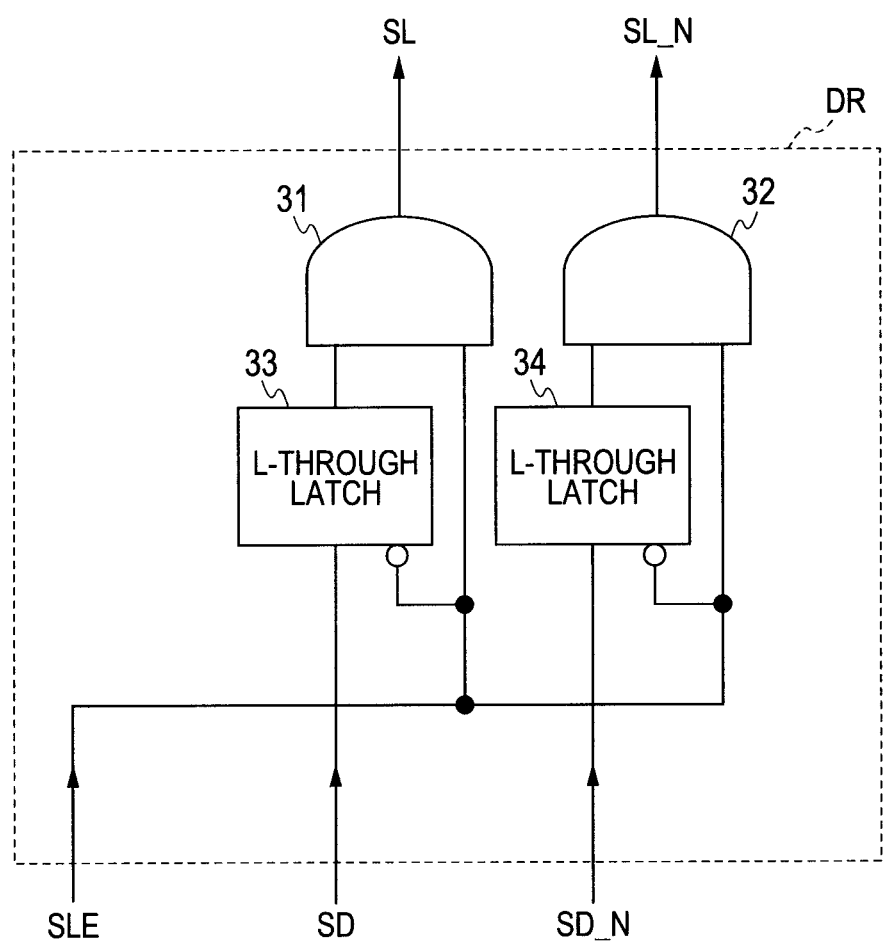
FIG. 4 is a block diagram showing a configuration of a search line driver DR shown in FIG. 2.

FIG. 4 is a block diagram showing a configuration of the search line driver DR shown in FIG. 2. Referring to FIG. 4, the search line driver DR includes AND circuits 31 and 32 and L-through D latches 33 and 34. Input terminals of the D latches 33 and 34 are inputted with search data SD and SD_N respectively. A search line enable signal SLE is inputted commonly to clock terminals of the D latches 33 and 34. An output signal of the D latch 33 and the search line enable signal SLE are inputted to the AND circuit 31. An output signal of the D latch 34 and the search line enable signal SLE are inputted to the AND circuit 32. Output signals of the AND circuits 31 and 32 are respectively supplied to the corresponding search lines SL and SL_N.

Since the outputs of the AND circuits 31 and 32 are brought to "0" where the search line enable signal SLE is in an inactive state ("0"), "0" is outputted to both of the search lines SL and SL_N. When the search line enable signal SLE is changed from the inactive state ("0") to the active state ("1") (the search line driver DR is activated), the D latches 33 and 34 hold therein the search data SD and SD_N when the search line enable signal is switched to the active state ("1"). During the active state ("1") of the search line enable signal SLE, the data retained in the D latches 33 and 34 are respectively supplied to the search lines SL and SL_N.

(5. Timing Diagram)

Figure 5:
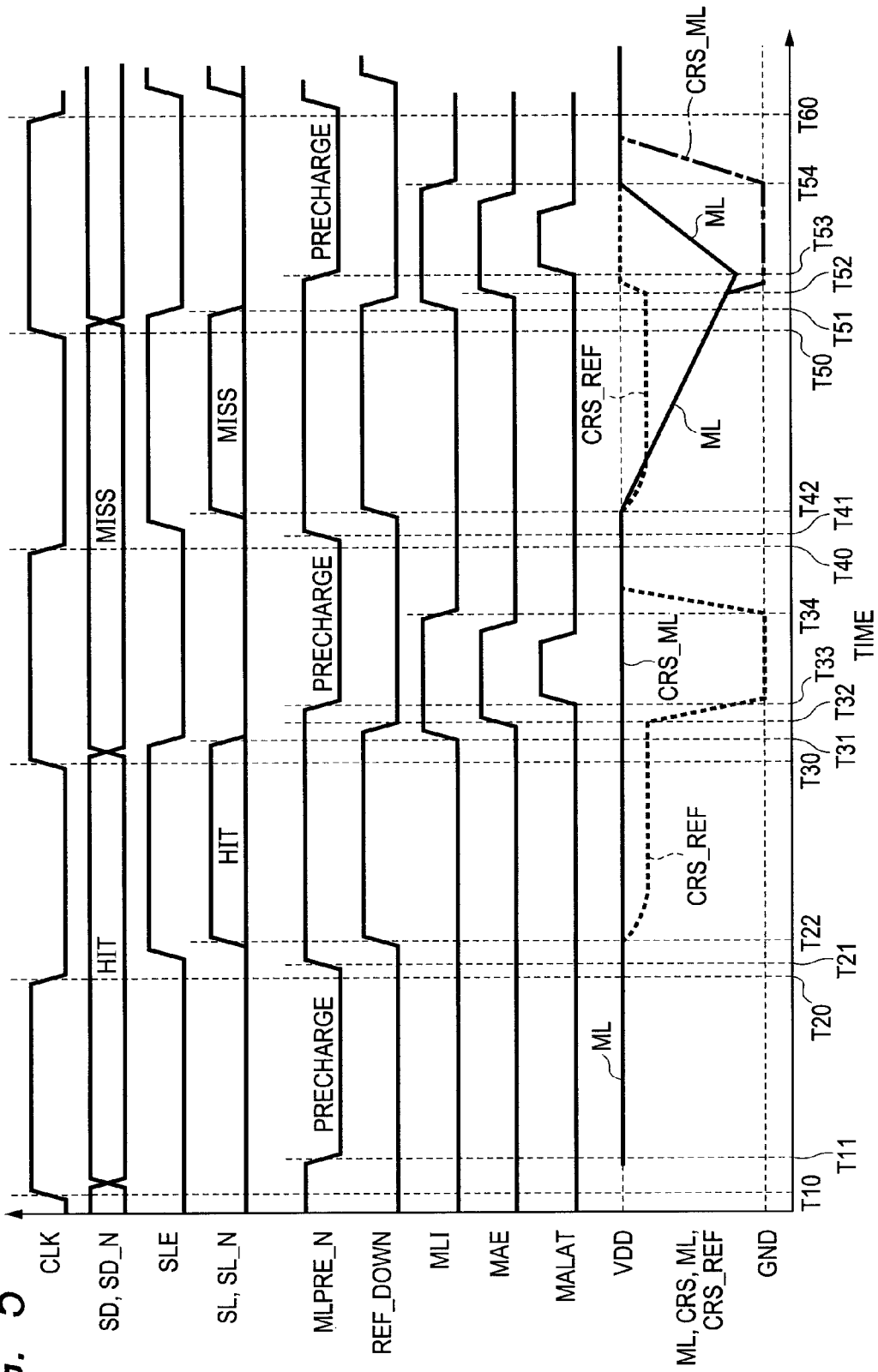
FIG. 5 is a timing diagram for explaining respective signals shown in FIGS. 3 and 4.

FIG. 5 shows respective waveforms of the clock CLK, search data SD and SD_N, search line enable signal SLE, voltages of search lines SL and SL_N, match line precharge signal MLPRE_N, control signal REF_DOWN and match amplifier control signals MLI, MAE and MALAT in order from above. The lowermost graph indicated by a solid line indicates the voltage waveform of the match line ML. A graph indicated by a one-dot chain line indicates the voltage waveform of the signal line CRS_ML of FIG. 3. A graph indicated by a dotted line indicates the voltage waveform of the signal line CRS_REF of FIG. 3. The timing diagram of FIG. 5 will be explained below with reference to FIGS. 3 through 5.

Firstly, new search data SD and SD_N are supplied in response to rise timings T10, T30 and T50 of the clock CLK. Assume that in FIG. 5, the search data SD and SD_N inputted between the times T10 and T30 match with the data stored in the CAM cell CC (HIT), and the search data SD and SD_N inputted between the times T30 and T50 mismatch with the data stored in the CAM cell CC (MISS).

The search line enable signal SLE is brought to the active state ("1") in response to fall timings T20, T40 and T60 of the clock CLK and brought to the inactive state ("0") in response to the rise timings T30 and T50 of the clock CLK. According to the activation of the search line enable signal SLE, the search data SD and SD_N are transferred to the search lines SL and SL_N between the times T22 and T31 and between the times T42 and T51.

The match line precharge signal MLPRE_N is brought to the active state ("0") in response to the rise timings T30 and T50 of the clock CLK and brought to the inactive state ("1") in response to the fall timings T20, T40 and T60 of the clock CLK. The match line precharge signal MLPRE_N is controlled so as not to be brought to the active state simultaneously with the search lines SL and SL_N. Namely, the timings T21 and T41 at which the match line precharge signal MLPRE_N is brought to the inactive state ("1"), are earlier than the timings T22 and T42 for activation at which the search data SD and SD_N are transferred to the search lines SL and SL_N. Further, the timings T33 and T53 at which the match line precharge signal MLPRE_N is brought to the active state ("0") are later than the timings T31 and T51 at which the search lines SL and SL_N are deactivated.

The control signal REF_DOWN is a signal for controlling the voltage level of the reference line ML_REF of FIG. 3. When the control signal REF_DOWN is in the inactive state ("0"), the voltage of the reference line ML_REF becomes equal to the power supply voltage. When the control signal REF_DOWN is in the active state ("1"), the voltage of the reference line ML_REF reaches a voltage made lower than the power supply voltage by a predetermined voltage (e.g., 100 mV or so). In FIG. 5, the control signal REF_DOWN is brought to the active state ("1") approximately in synchronization with the search line enable signal SLE.

The match amplifier control signals MLI, MAE and MALAT are placed in the active state ("1") only for a predetermined period in response to the rise timings T30 and T50 of the clock CLK. At this time, they are brought to the active state ("1") in the order of MLI, MAE and MALAT and brought to the inactive state ("0") in the order of MALAT, MAE and MLI. The match amplifier control signals MLI, MAE and MALAT are also controlled so as not to reach the active state simultaneously with the search lines SL and SL_N. Namely, the timings at which the match amplifier control signals MLI, MAE and MALAT are asserted, are later than the timings T31 and T51 at which the search lines SL and SL_N are deactivated.

As a result of the supply of the respective signals with the above-described timings, the voltage waveforms at the match line ML and the signal lines CRS_ML and CRS_REF indicate such changes as shown in the lower part of FIG. 5. These voltage waveforms will be described below in the order of the flow of time.

While the match line precharge signal MLPRE_N is being in the active state ("0") at the times T11 through T21, the match line ML, reference line ML_REF and signal lines CRS_ML and CRS_REF are precharged to a predetermined voltage (power supply voltage VDD in FIG. 5).

At the next time T22, the control signal REF_DOWN is asserted so that the voltage level of the reference line ML_REF is made lower than the power supply voltage VDD. Thus, the voltage level of the signal line CRS_REF is also reduced.

During from the times T22 to T31, the search data SD and SD_N are transferred to the search lines SL and SL_N to thereby activate the search lines SL and SL_N. Since the search data SD and SD_N and the data stored in the corresponding CAM cell CC are matched with each other (HIT) during this period of time, the voltages of the match line ML and the signal line CRS_ML remain unchanged and hence the power supply voltage VDD is maintained.

Subsequently, the match amplifier control signal MLI is asserted so that the transfer gates QP2 and QP3 shown in FIG. 3 are cut off. At the next time T32, the match amplifier control signal MAE is asserted so that the comparison circuit 21 of FIG. 3 starts operating. As a result, the voltage of the signal line CRS_REF is lowered to the ground voltage GND. Further, the match amplifier control signal MALAT is asserted so that the latch circuit 22 of FIG. 3 outputs a search result MAO_N.

At the next time T33, the match line precharge signal MLPRE_N is brought to the active state ("0") in parallel with the operation of the comparison circuit 21. Thus, the match line ML is precharged for the next data search.

After the operation of comparison by the comparison circuit 21 has been ended, the match amplifier control signal MLI returns to the inactive state ("0") at the time T34, so that the transfer gates QP2 and QP3 of FIG. 3 are brought into conduction. Consequently, the voltage of the signal line CRS_REF rises to the power supply voltage VDD. The first data search is completed as described above.

At the next time T41, the match line precharge signal MLPRE_N is brought to the inactive state ("1"), so that the precharge of the match line ML, reference line ML_REF and signal lines CRS_ML and CRS_REF is completed.

At the next time T42, the control signal REF_DOWN is asserted so that the voltage level of the reference line ML_REF is made lower than the power supply voltage VDD by a predetermined voltage. Thus, the voltage level of the signal line CRS_REF is also reduced by the predetermined voltage.

During from the next time T42 to the time T51, the corresponding search data SD and SD_N are transferred to the search lines SL and SL_N. Since the search data SD and SD_N and data stored in the corresponding CAM cell CC are brought into mismatch (MISS) in this case, the electric charges of the precharged match line ML and signal line CRS_ML are discharged via the CAM cell CC. As a result, the voltages of the match line ML and signal line CRS_ML are gradually reduced.

Subsequently, the match amplifier control signal MLI is asserted so that the transfer gates QP2 and QP3 shown in FIG. 3 are cut off. At the next time T52, the match amplifier control signal MAE is asserted so that the comparison circuit 21 of FIG. 3 starts operating. As a result, the voltage of the signal line CRS_ML is lowered to the ground voltage GND. Further, the match amplifier control signal MALAT is asserted so that the latch circuit 22 of FIG. 3 outputs a search result MAO_N.

At the next time T53, the match line precharge signal MLPRE_N is brought to the active state ("0") in parallel with the operation of the comparison circuit 21. Thus, the match line ML is precharged for the next data search. As a result, the voltage of the match line ML gradually rises toward the power supply voltage VDD.

After the operation of comparison by the comparison circuit 21 has been ended, the match amplifier control signal MLI returns to the inactive state ("0") at the time T54, so that the transfer gates QP2 and QP3 of FIG. 3 are brought into conduction. Consequently, the voltage of the signal line CRS_REF also rises to the power supply voltage VDD.

[Notes for Timing Control of Content Addressable Memory]

It is necessary to avoid simultaneous occurrence of the assertion of the match line precharge signal MLPRE_N and the assertion of the search line pair SL and SL_N (transfer of search data SD and SD_N) upon the data search as described above. This is because if the activation of the search lines SL and SL_N and the precharge of each match line coincide with each other, the following problems come up.

Firstly, a through current flows from the precharge PMOS transistor QP2 to the CAM cell CC both shown in FIG. 3. Secondly, there is a possibility that the match line ML will be charged to the H level by the assertion of the match line precharge signal MLPRE_N despite the result of the data search is brought into mismatch (MISS), thus resulting in the output of an erroneous search result.

Accordingly, it is important that the timing provided to assert the search line enable signal SLE and the timing provided to assert the match line precharge signal MLPRE_N are adjusted. Described concretely, it is necessary to start the transfer of the search data SD and SD_N to the search line pair SL and SL_N (the activation of the search line pair SL and SL_N) after the precharge of the match line ML has been ended. It is further necessary to assert the match line precharge signal MLPRE_N after the search lines SL and SL_N have reached the inactive state and then start the precharge of the match line ML.

In addition to the above points, it is necessary to pay attention even to the timings provided to assert the match amplifier control signals MLI, MAE and MALAT after the transfer of the search data SD and SD_N to the search lines SL and SL_N. This is because although the match line ML is discharged by the CAM cell CC where the result of the data search is brought into mismatch (MISS), it takes time to transfer a reduction in the voltage of the match line ML due to the capacitance of the match line ML to the match amplifier MA as the CAM cell CC increases distance from the CAM cell CC.

In the conventional content addressable memory, such timing control has been performed by a delay circuit using a plurality of stages of inverters. Therefore, since the influence of fluctuations in the characteristics of the MOS transistors due to a manufacturing process, and the influence of variations in the power supply voltage and operating temperatures grow, time has been spent on the design of timing. Further, the speeding-up of the operating frequency of the content addressable memory encountered difficulties in the design itself of the delay circuit. The content addressable memory 100 according to the first embodiment is capable of suppressing the influence of the process fluctuations and the influence of the variations in the power supply voltage and the operating temperatures by using the timing control method different from the conventional one. The details thereof will be explained below.

[Details of Timing Control of Content Addressable Memory 100]

Referring again to FIG. 2, the content addressable memory 100 includes the search control circuit 40 provided to control operating timings of the match amplifier MA and search line driver DR. In FIG. 1, the search control circuit 40 is provided on the −Y-direction side of the match detection unit 20 (match amplifier MA) and on the −X-direction side of the search data transfer unit 30 (search line driver DR).

The search control circuit 40 receives the clock CLK from the clock buffer 76 of FIG. 1 and receives a search signal SCM and a reset signal RST_N from the instruction code decoder 77. The search control circuit 40 generates the above-described search line enable signal SLE, match line precharge signal MLPRE_N and match amplifier control signals MLI, MAE, MAE_N and MALAT, based on the received signals and outputs them therefrom.

A characteristic point of the content addressable memory 100 is that one control signal line 36 (36A, 36B and 36C) is provided to transmit the search line enable signal SLE to the respective search line drivers DR. The control signal line 36 includes a wiring portion 36A extending in the +X direction from an output node of the search control circuit 40, a return portion 36B at which the search line enable signal SLE is turned back, and a wiring portion 36C extending in the −X direction from the return portion 36B to the search control circuit 40.

The wiring portion 36C is coupled to the respective search line drivers DR in the arrangement order of the search line drivers DR and further coupled to the search control circuit 40. Thus, after the search line enable signal SLE has been outputted from the search control circuit 40, it passes through the wiring portion 36A and reaches the return portion 36B. The search line enable signal SLE turned back at the return portion 36B first passes through a coupling node of the search line driver DR [79] farthest from the match amplifier MA and the wiring portion 36C. Then, the search line enable signal SLE passes through coupling nodes of the search line drivers DR and the wiring portion 36C in the order of the search line drivers DR [78], DR [77], . . . , DR [0]. The search line enable signal SLE finally reaches the search control circuit 40 again. Subsequently, the search line enable signal at the time that it has been transmitted from the search control circuit 40, is described as SLE_SND, and the search line enable signal at the time that it has been received by the search control circuit 40 again, is described as SLE_RCV.

Owing to the provision of the above control signal line 36, the first search line driver DR [79] is activated after the time taken to cause the search line enable signal SLE to propagate through at least the first wiring portion 36A has elapsed since the assertion of the search line enable signal SLE by the search control circuit 40. Thus, the time taken for the transmission of the search line enable signal SLE from the search control circuit 40 to the search line driver DR [79] can be made longer than the time taken for the transmission of the match line precharge signal MLPRE_N from the search control circuit 40 to any precharge unit PC. As a result, it is possible to start the transfer of the search data SD and SD_N to the search line pair SL and SL_N (activation of search lines SL and SL_N) after the precharge of the match line ML by the corresponding precharge unit PC has been completed.

Here, the transmission time of the search line enable signal SLE is determined by an RC delay of the control signal line 36. It is thus possible to control the signal transmission time according to the length, width and thickness of each wiring. Unlike the conventional delay circuit using the cascade-coupled inverters, the present example is not affected by the fluctuations in the manufacturing process of the transistors. The transmission time can also be adjusted by inserting a high-resistance wiring portion in series with the control signal line 36 or providing a capacitive load in parallel with the control signal line 36.

Further, the match line precharge signal MLPRE_N and the match amplifier control signals MLI, MAE and MALAT can be generated by providing the above control signal line 36 using the search line enable signal SLE_RCV returned to the search control circuit 40. It is thus possible to easily assert the match line precharge signal MLPRE_N and the match amplifier control signals MLI, MAE and MALAT after the search lines SL and SL_N have been brought to the inactive state.

Furthermore, since the search lines SL and SL_N are activated in order from those far away from each match amplifier MA, there is no need to consider a wiring delay of each match line ML in order to determine the timing provided to activate the match amplifier MA.

Providing the control signal line 36 having the above configuration as described above makes it possible to easily control the timing for activating the search lines SL and SL_N and the timing for asserting the match line precharge signal MLPRE_N even without using the delay circuit. As a result, the content addressable memory can be operated at a frequency higher than a conventional one.

[Configuration of Search Control Circuit 40]

A concrete configuration example of the search control circuit 40 will be explained below.

Figure 6:
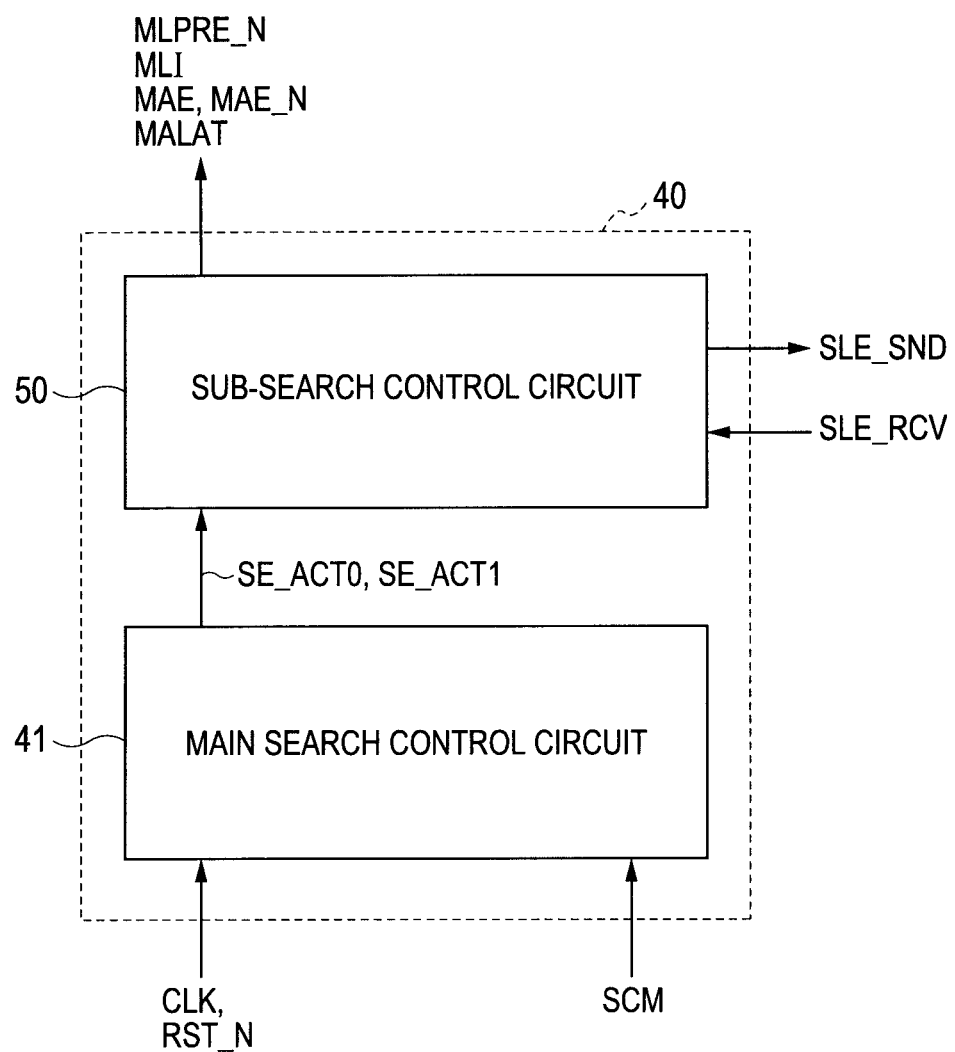
FIG. 6 is a block diagram illustrating a configuration of a search control circuit 40 shown in FIG. 1.

FIG. 6 is a block diagram showing a configuration of the search control circuit 40 shown in FIG. 1. Referring to FIG. 6, the search control circuit 40 includes a main search control circuit 41 and a sub-search control circuit 50.

The main search control circuit 41 generates a trigger signal SE_ACT0 for precharging the corresponding match line ML and a trigger signal SE_ACT1 for activating the corresponding search lines SL and SL_N, based on the clock CLK, search signal SCM and reset signal RST_N received therein.

The sub-search control circuit 50 generates and outputs a search line enable signal SLE_SND, based on the trigger signal SE_ACT1 for the activation of the search lines SL and SL_N. Further, the sub-search control circuit 50 generates and outputs a match line precharge signal MLPRE_N, based on the received search line enable signal SLE_RCV and trigger signal SE_ACT0 for the precharge of each match line ML. The sub-search control circuit 50 further generates and outputs match amplifier control signals MLI, MAE and MALAT, based on the received search line enable signal SLE_RCV.

(1. Configuration of Main Search Control Circuit 41)

Figure 7:
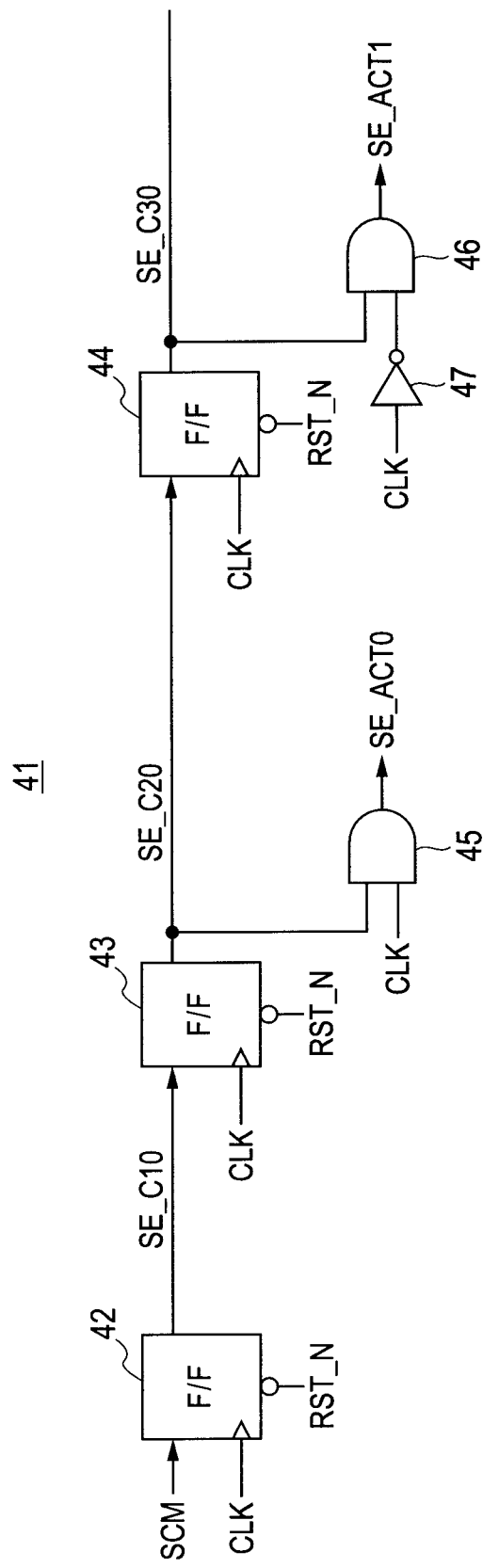
FIG. 7 is a block diagram depicting a main search control circuit 41 shown in FIG. 6.

FIG. 7 is a block diagram showing a configuration of the main search control circuit 41 shown in FIG. 6. Referring to FIG. 7, the main search control circuit 41 includes D flip-flops 42 through 44, AND circuits 45 and 46 and an inverter 47.

The D flip-flop 42 retains the search signal SCM at a timing of a rising edge of the clock CLK and outputs its retained value (SE_C10) therefrom.

The D flip-flop 43 retains the output signal SE_C10 of the D flip-flop 42 at a timing of a falling edge of the clock CLK and outputs its retained value (SE_C20) therefrom.

The D flip-flop 44 retains the output signal SE_C20 of the D flip-flop 43 at a timing of a rising edge of the clock CLK and outputs its retained value (SE_C30) therefrom.

The AND circuit 45 performs an arithmetic operation on the AND of the output signal SE_C20 of the D flip-flop 43 and the clock CLK and outputs the result of the arithmetic operation as a trigger signal SE_ACT0 for precharging each match line ML.

The AND circuit 46 performs an arithmetic operation on the AND of the output signal SE_C30 of the D flip-flop 44 and a signal obtained by inverting the clock CLK by means of the inverter 47 and outputs the result of the arithmetic operation as a trigger SE_ACT1 for activation of the search lines SL and SL_N.

The D flip-flops 42 through 44 further receive a reset signal RST_N therein. When the reset signal RST_N is brought to an active state ("0"), the outputs signals of the D flip-flops 42 through 44 are all reset to "0".

Figure 8:
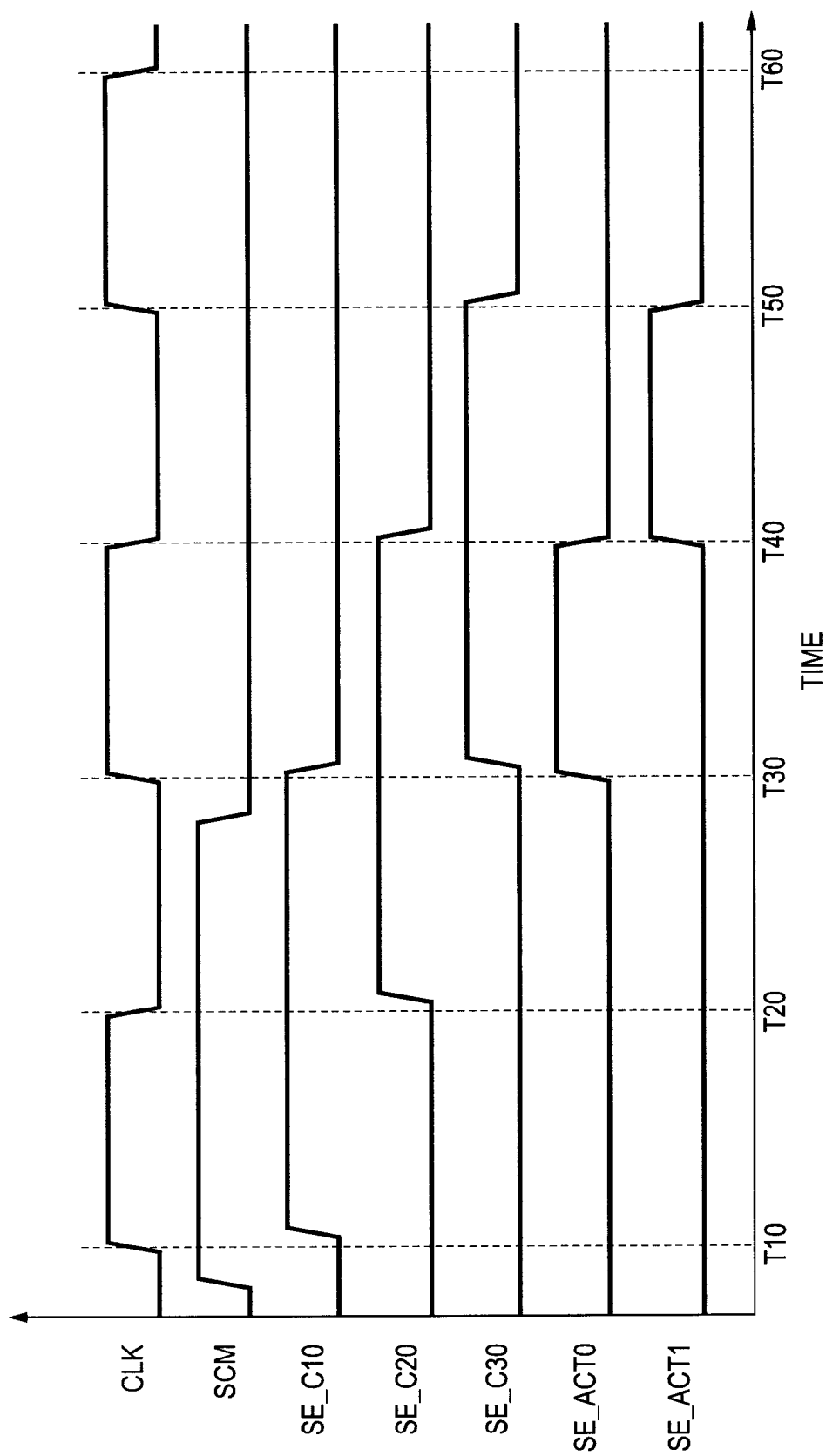
FIG. 8 is a timing diagram for explaining respective signals shown in FIG. 7.

FIG. 8 is a timing diagram for describing the respective signals shown in FIG. 7. Referring to FIGS. 7 and 8, the clock CLK is assumed to rise at timings of times T10, T30 and T50 and fall at timings of times T20, T40 and T60.

At the time T10 at which the clock CLK rises, the search signal SCM is in an active state ("1"). Thus, the output signal SE_C10 of the D flip-flop 42 becomes an H level between the time T10 and the time T30 at which the next clock CLK rises.

Next, at the time T20 at which the clock CLK falls, the output signal SE_C10 of the D flip-flop 42 is at the H level. Thus, the output signal SE_C20 of the D flip-flop 43 becomes an H level between the time T20 and the time T40 at which the next clock CLK falls.

Next, at the time T30 at which the clock CLK rises again, the output signal SE_C20 of the D flip-flop 43 is at the H level. Thus, the output signal SE_C30 of the D flip-flop 44 becomes an H level between the time T30 and the time T50 at which the next clock CLK rises.

Since the output signals SE_C20 of the D flip-flop 43 and the clock CLK are both of the H level between the next times T30 and T40, the trigger signal SE_ACT0 corresponding to the output of the AND circuit 45 are brought to the H level. Namely, the trigger signal SE_ACT0 for the precharge of each match line ML is brought to the active state ("1") during a half cycle (T30 to T40) corresponding to the first half of one cycle of the clock CLK.

Since the output signal SE_C30 of the flip-flop 44 is at the H level and the clock CLK is at an L level between the next times T40 and T50, the trigger signal SE_ACT1 corresponding to the output of the AND circuit 46 becomes an H level. Namely, the trigger signal SE_ACT1 for activation of the search lines SL and SL_N is brought to the active state ("1") during a half cycle (T40 to T50) corresponding to a last half of one cycle of the clock CLK.

(2. Configuration of Sub-Search Control Circuit 50)

Figure 9:
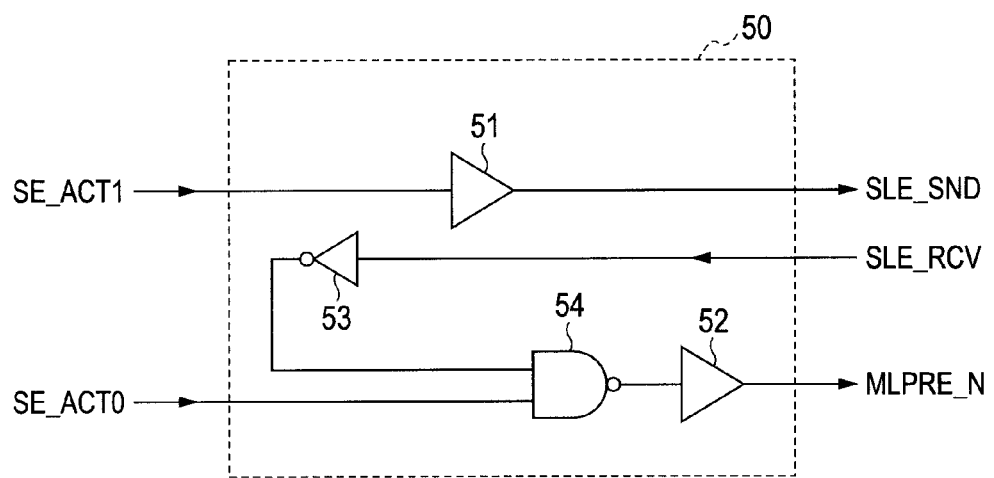
FIG. 9 is a block diagram showing a partial configuration of a sub-search control circuit 50 shown in FIG. 6 (generation of search line enable signal SLE and match line precharge signal MLPRE_N)

FIG. 9 is a block diagram showing a partial configuration of the sub-search control circuit 50 shown in FIG. 6. FIG. 9 shows the configuration of the sub-search control circuit 50 related to the search line enable signal SLE and the match line precharge signal MLPRE_N.

As shown in FIG. 9, the sub-search control circuit 50 includes buffer circuits 51 and 52, an inverter 53 and a NAND circuit 54.

The buffer circuit 51 shapes the trigger signal SE_ACT1 for activation of the search lines SL and SL_N and outputs it as a search line enable signal SLE_SND.

The NAND circuit 54 performs a NAND operation on a signal obtained by inverting the received search line enable signal SLE_RCV by the inverter 53 and the trigger signal SE_ACT0 for precharging each match line ML.

The buffer circuit 52 shapes the result of operation by the NAND circuit 54 and outputs it as a match line precharge signal MLPRE_N.

According to the above configuration, even though the trigger signal SE_ACT0 is asserted, the match line precharge signal MLPRE_N is not brought to the active state ("0") while the search line enable signal SLE_RCV is being in the active state ("1"). The search line enable signal SLE_RCV is brought to the inactive state ("0"), thereby making it possible to assert the match line precharge signal MLPRE_N.

Figure 10:
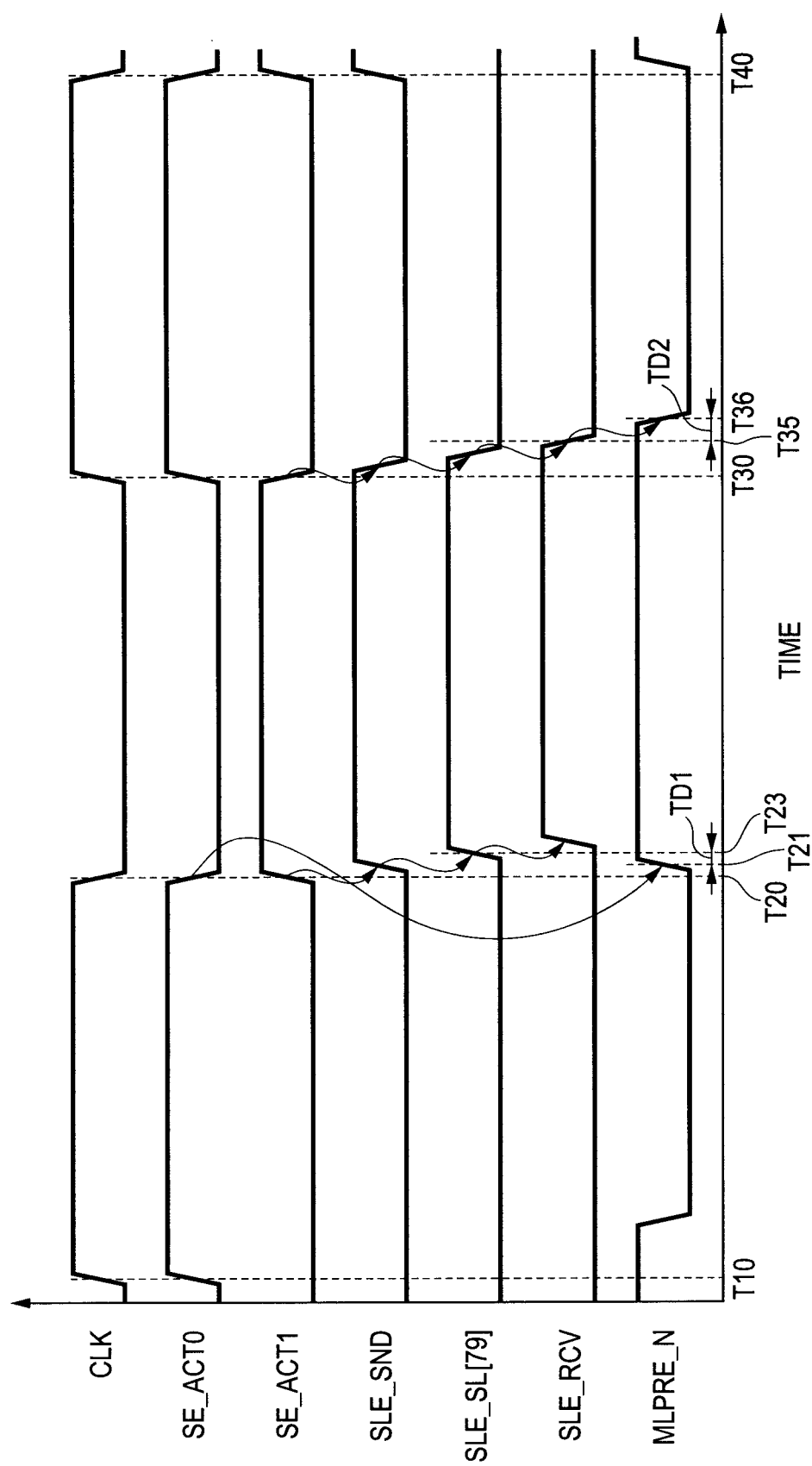
FIG. 10 is a timing diagram for explaining the respective signals shown in FIG. 9.

FIG. 10 is a timing diagram for describing the respective signals shown in FIG. 9. FIG. 10 shows respective waveforms of the clock CLK, trigger signals SE_ACT0 and SE_ACT1, search line enable signal SLE_SND at the transmission, search line enable signal SLE SL [79] that has reached the search line driver DR [79], search line enable signal SLE_RCV at the reception by the search control circuit 40, and match line precharge signal MLPRE_N in order from above. The clock CLK is assumed to rise at timings of times T10 and T30 and fall at timings of times T20 and T40.

As shown in FIG. 10, the trigger signal SE_ACT0 for precharge of each match line ML changes to an L level at the time T20. The match line precharge signal MLPRE_N changes to an H level in response to it at a time T21, thereby leading to the completion of the precharge of the match line ML.

Further, the trigger signal SE_ACT1 for activation of the search lines SL and SL_N changes to an H level at the time T20. The search line enable signal SLE_SND changes to an H level in response to it (it is asserted). The search line enable signal SLE SL [79] received at the search line driver DR [79] is asserted at a time T23 delayed by a wiring delay from the assertion of the search line enable signal SLE_SND. Further, the search line enable signal SLE_RCV received at the search control circuit 40 is asserted with being delayed by the wiring delay.

Thus, a time margin TD1 can be provided between the time T21 at which the precharge of the match line ML is completed and the time T23 at which the search lines SL [79] and SL_N [79] are first activated.

Next, at the time T30, the trigger signal SE_ACT0 for the precharge of the match line ML changes to the H level, so that the match line precharge signal MLPRE_N is brought to an assertable state. Since, however, the search line enable signal SLE_RCV received at the search control circuit 40 is at the H level at this time, the match line precharge signal MLPRE_N is not asserted. The match line precharge signal MLPRE_N is asserted after the search line enable signal SLE_RCV received at the search control circuit 40 has been brought to the L level (time T36).

As described in FIG. 2, the search line enable signal SLE reaches the search control circuit 40 after it has passed through the coupling node between each search line driver DR and the control signal line 36. Thus, the non-activation of all search line pairs SL and SL_N is completed up to a time T35 at which the search line enable signal SLE_RCV has been de-asserted. As a result, a time margin TD2 can be provided between the time T35 at which the non-activation of all the search line pairs SL and SL_N is completed and a time T36 at which the match line precharge signal MLPRE_N is asserted.

As described above, the content addressable memory 100 is capable of controlling the timings for the match line precharge signal MLPRE_N and the search line enable signal SLE without using the delay circuit in which the plural inverters are coupled in tandem.

Figure 11:
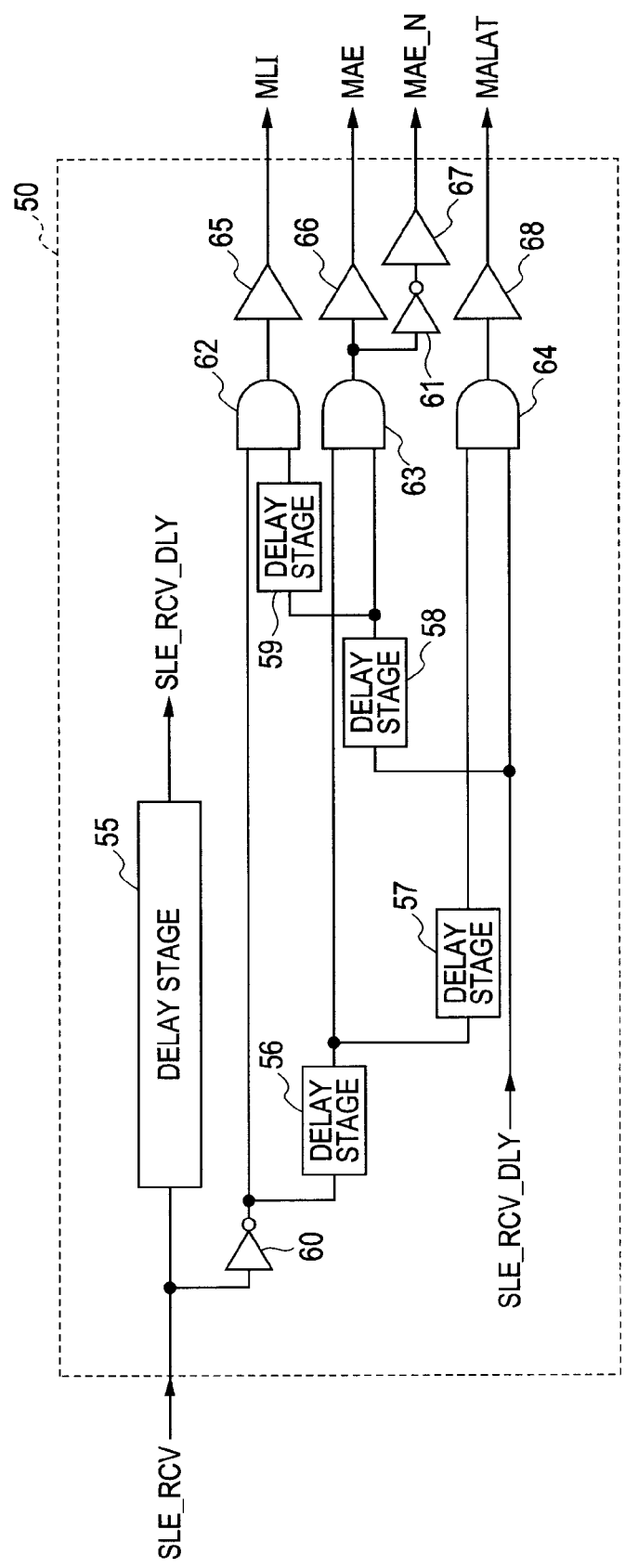
FIG. 11 is a block diagram illustrating a partial configuration of the sub-search control circuit 50 shown in FIG. 6 (generation of match amplifier control signal MAE and the like)

FIG. 11 is a block diagram showing a partial configuration of the sub-search control circuit 50 shown in FIG. 6. FIG. 11 illustrates the configuration of the sub-search control circuit 50 related to the generation of the match amplifier control signals MLI, MAE, MAE_N and MALAT.

As shown in FIG. 11, the sub-search control circuit 50 includes delay stages 55 through 59, inverters 60 and 61, AND circuits 62 through 64 and buffer circuits 65 through 68.

The AND circuit 62 performs an AND operation on a signal obtained by inverting the search line enable signal SLE_RCV by the inverter 60 and a signal obtained by delaying the search line enable signal SLE_RCV by the delay stages 55, 58 and 59. The result of operation by the AND circuit 62 is shaped by the buffer circuit 65, which in turn is outputted as the match amplifier control signal MLI.

The AND circuit 63 performs an AND operation on a signal obtained by inverting the search line enable signal SLE_RCV by the inverter 60 and then delaying it by the delay stage 56, and a signal obtained by delaying the search line enable signal SLE_RCV by the delay stages 55 and 58. The result of operation by the AND circuit 63 is shaped by the buffer circuit 66, which in turn is outputted as the match amplifier control signal MAE. The result of operation by the AND circuit 63 is further inverted by the inverter 61 and shaped by the buffer circuit 67, which in turn is outputted as the match amplifier control signal MAE_N.

The AND circuit 64 performs an AND operation on a signal obtained by inverting the search line enable signal SLE_RCV by the inverter 60 and delaying it by the delay stages 56 and 57, and a signal obtained by delaying the search line enable signal SLE_RCV by the delay stage 55. The result of operation by the AND circuit 64 is shaped by the buffer circuit 68, which in turn is outputted as the match amplifier control signal MALAT.

Figure 12:
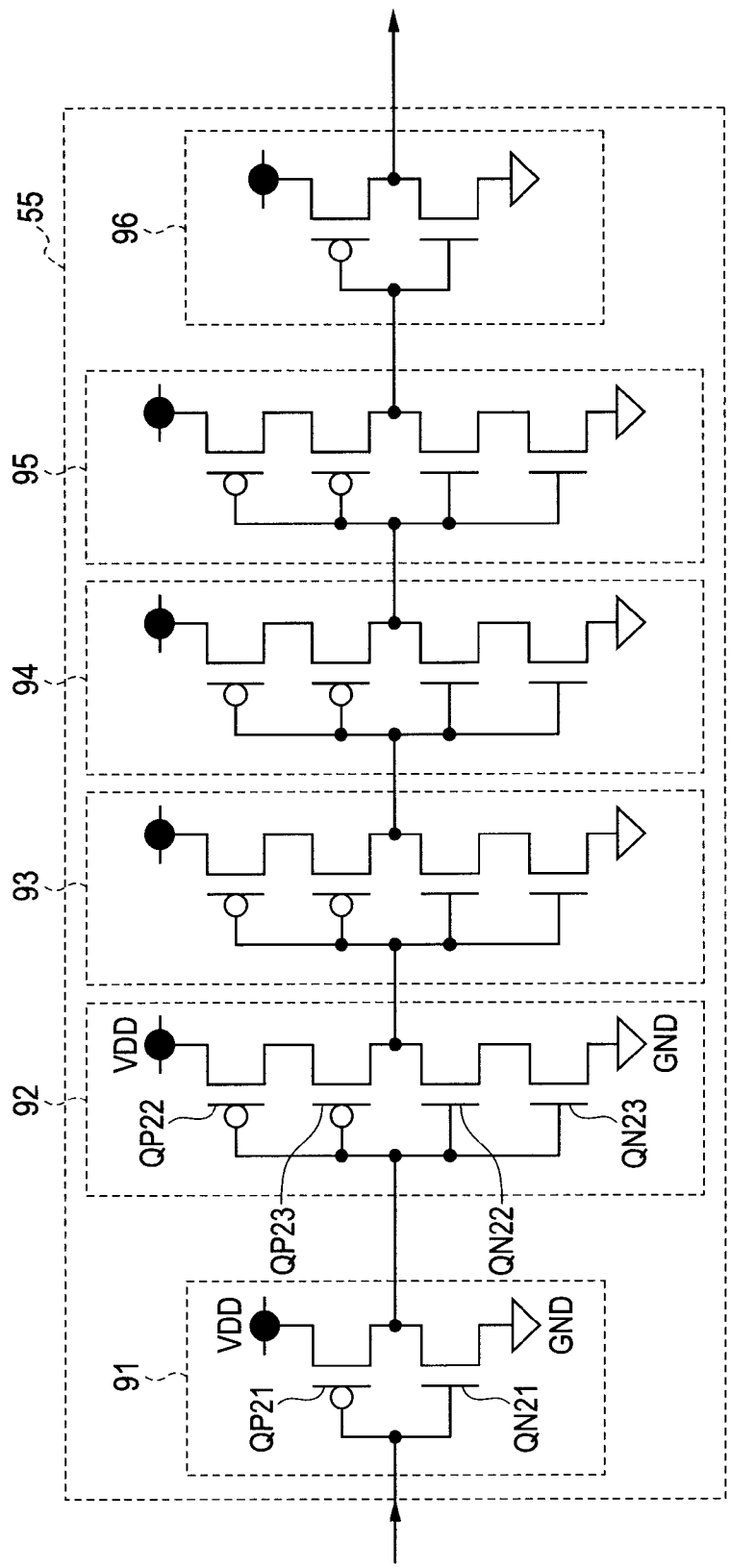
FIG. 12 is a block diagram showing one example of a configuration of a delay stage 55 shown in FIG. 11.

FIG. 12 is a block diagram showing one example of a configuration of the delay stage 55 shown in FIG. 11. Referring to FIG. 12, the delay stage 55 is comprised of CMOS (Complementary Metal-Oxide Semiconductor) inverters 91 through 96 coupled in tandem.

The CMOS inverters 91 and 96 of the first and last stages respectively include PMOS transistors QP21 and NMOS transistors QN21 coupled in series between the power supply node VDD and the ground node GND. The signal sent from the preceding stage is inputted to gates of the transistors QP21 and QN21. A signal obtained by inverting the input signal is outputted from a coupling node of the transistors QP21 and QN21.

The interstage CMOS inverters 92 through 95 respectively include PMOS transistors QP22 and QP23 and NMOS transistors QN22 and QN23 coupled in series between the power supply node VDD and the ground node GND. A signal sent from the preceding stage is inputted to gates of the transistors QP22, QP23, QN22 and QN23, and a signal obtained by inverting the input signal is outputted from a coupling node of the transistors QP23 and QN22. A delay time can be adjusted by increasing or decreasing the number of the stages of the interstage CMOS inverters 92 through 95.

Configurations of other delay stages 56 through 59 shown in FIG. 11 are also similar to FIG. 12. Since, however, delay times of these delay stages 56 through 59 are shorter than a delay time of the delay stage 55, the number of the stages of the interstage CMOS inverters is smaller than the number of the stages in the delay stage 55.

Figure 13:
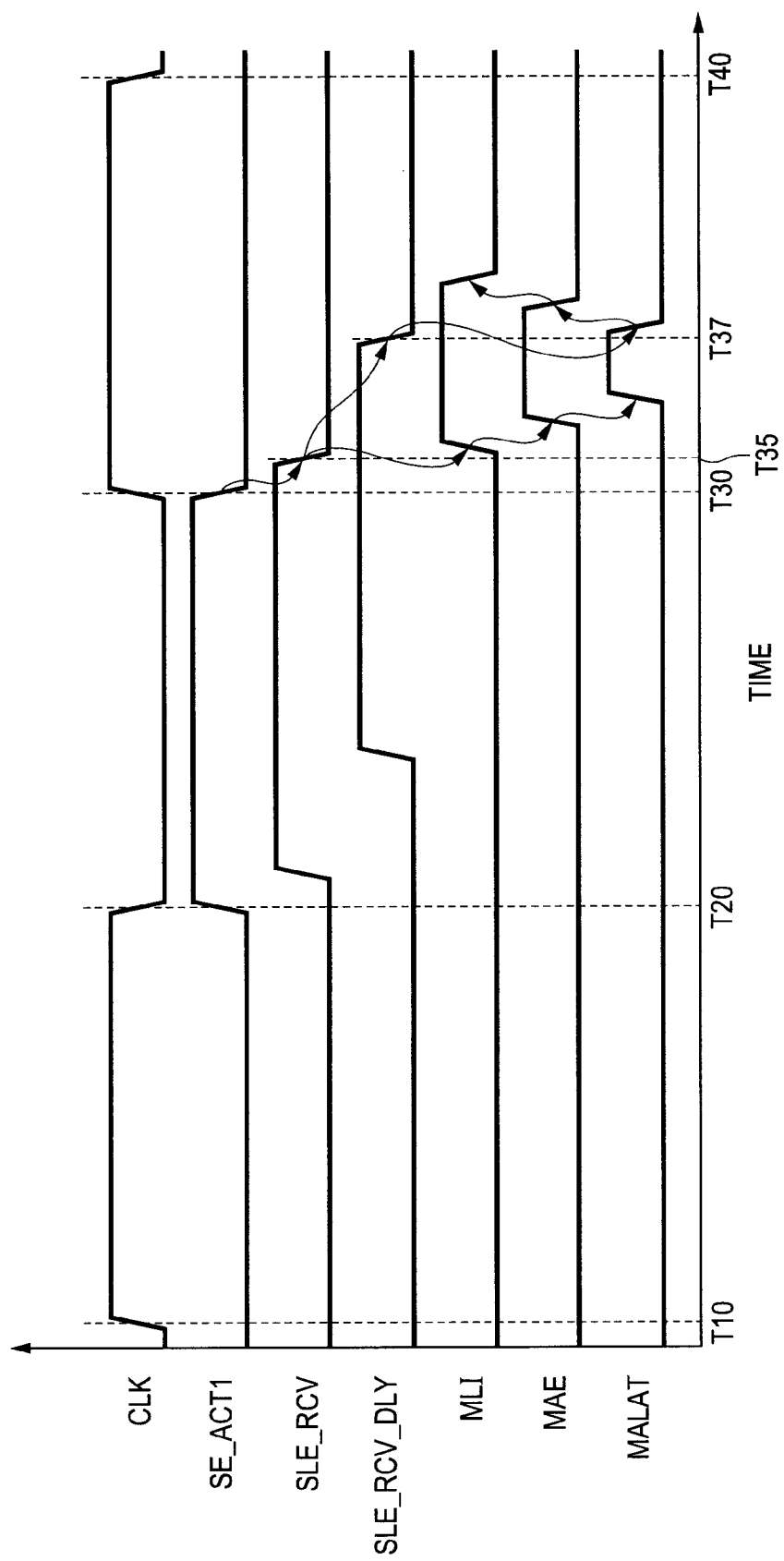
FIG. 13 is a timing diagram for explaining the respective signals shown in FIG. 11.

FIG. 13 is a timing diagram for describing the respective signals shown in FIG. 11. FIG. 13 shows waveforms of the clock CLK, trigger signal SE_ACT1, search line enable signal SLE_RCV received at the search control circuit 40, output signal SLE_RCV_DLY of the delay stage 55 of FIG. 11, and match amplifier control signals MLI, MAE and MALAT in order from above. The clock CLK is assumed to rise at timings of times T10 and T30 and fall at timings of times T20 and T40.

As shown in FIG. 13, the trigger signal SE_ACT1 for activation of the search lines SL and SL_N changes to an L level at the time T30. Since the search line enable signal SLE changes to an L level in response to it, the search line enable signal SLE_RCV received at the search control circuit 40 changes to an L level at a time T35 delayed by a wiring delay. The match amplifier control signals MLI, MAE and MALAT change to an H level in this order in response to the falling edge of the search line enable signal SLE_RCV.

Next, the output signal SLE_RCV_DLY of the delay stage 55 shown in FIG. 11 changes to an L level at a time T37 delayed by a predetermined delay time. The match amplifier control signals MALAT, MAE and MLI change to an L level in this order in response to the falling edge of the output signal SLE_RCV_DLY of the delay stage 55.

Comparative Example

Figure 14:
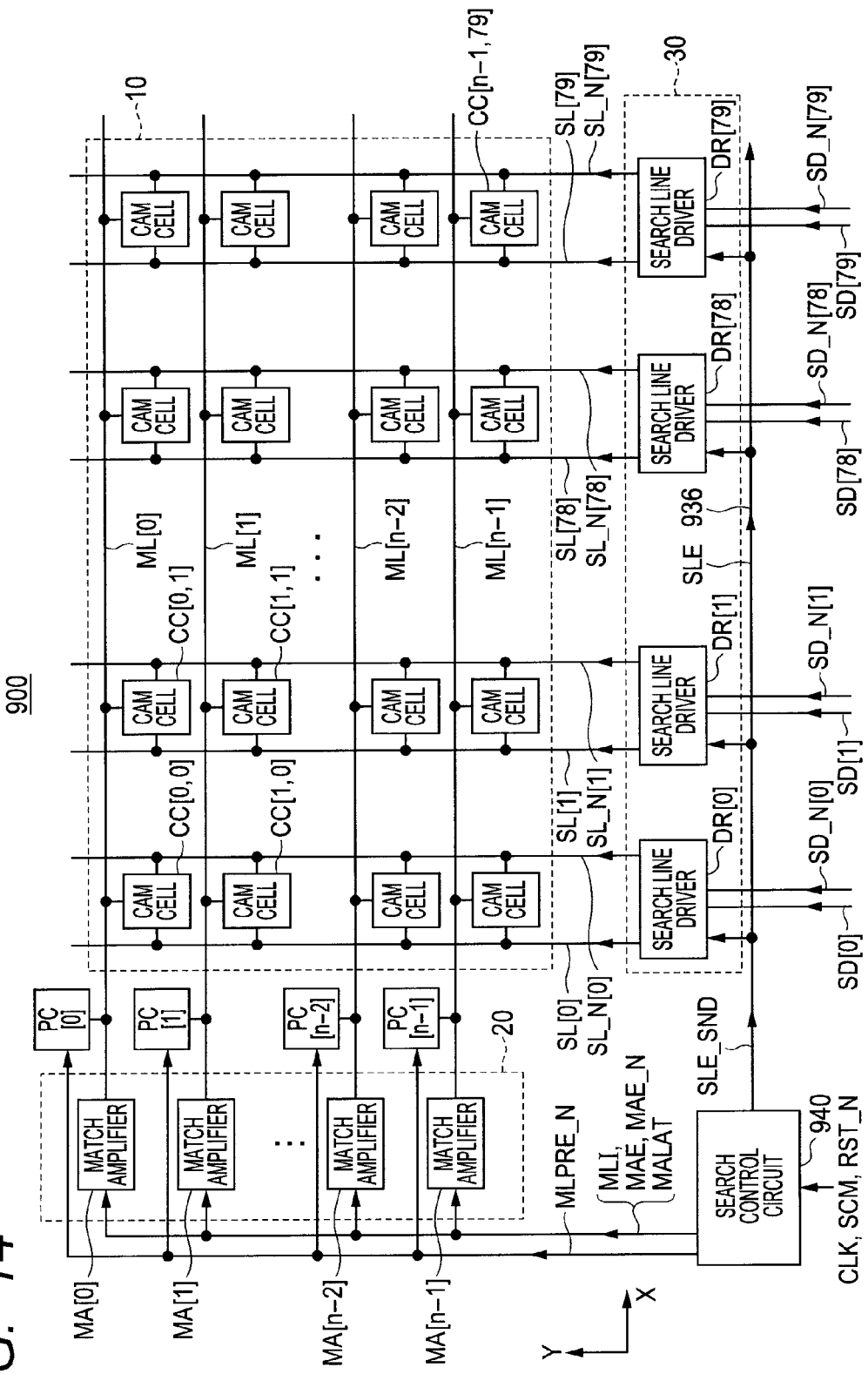
FIG. 14 is a block diagram depicting a configuration of a content addressable memory 900 as a comparative example of the content addressable memory 100 shown in FIG. 2.

FIG. 14 is a block diagram showing a configuration of a content addressable memory 900 as a comparative example of the content addressable memory 100 shown in FIG. 2.

The content addressable memory 900 shown in FIG. 14 is different from the content addressable memory 100 shown in FIG. 2 in that it includes a control signal line 936 extending in a +X direction from a search control circuit 940 instead of the control signal line 36 shown in FIG. 2. The control signal line 936 is coupled to respective search line drivers DR in the arrangement order of the search line drivers DR as viewed from the side near each match amplifier MA. A search line enable signal SLE transmitted in the +X direction reaches the respective search line drivers DR in the numeric order of the search line drivers DR without being folded back in mid course.

Figure 15:
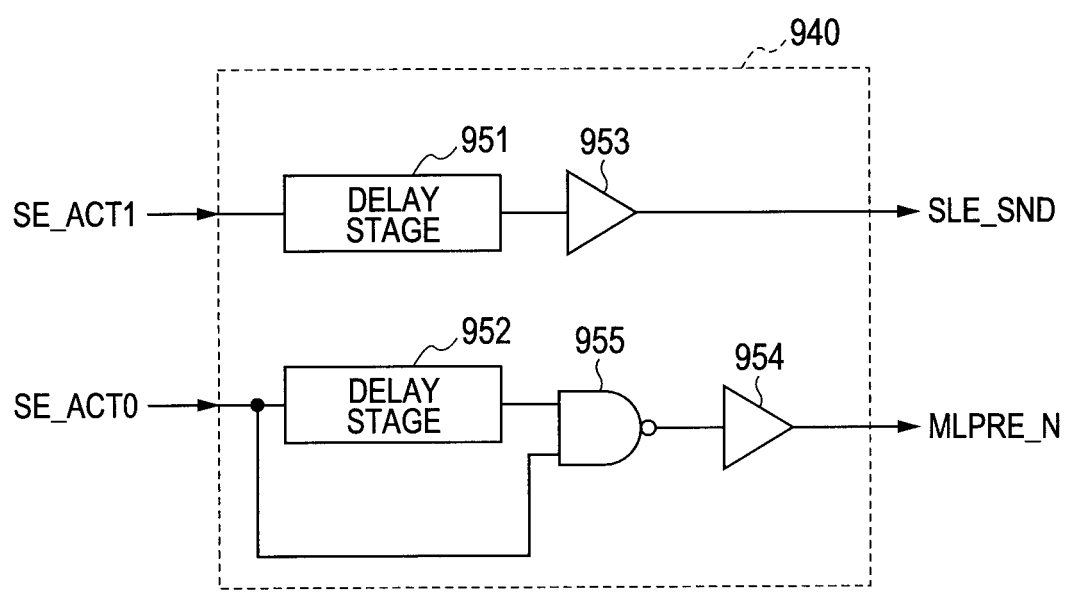
FIG. 15 is a block diagram showing a partial configuration of a search control circuit 940 shown in FIG. 14.

FIG. 15 is a block diagram showing a partial configuration of the search control circuit 940 shown in FIG. 14. FIG. 15 shows a configuration of the search control circuit 940 related to the generation of the search line enable signal SLE and a match line precharge signal MLPRE_N.

As shown in FIG. 15, the search control circuit 940 includes delay stages 951 and 952, buffer circuits 953 and 954 and a NAND circuit 955. The search line enable signal SLE_SND is generated by being shaped by the buffer circuit 953 after the trigger signal SE_ACT1 for activation of the search lines SL and SL_N of FIG. 8 has been delayed by the delay stage 951. The match line precharge signal MLPRE_N is generated by shaping a result of a NAND operation on the trigger signal SE_ACT0 for precharge of the match line ML in FIG. 8 and the trigger signal SE_ACT0 delayed by the delay stage 952 by means of the buffer circuit 954.

Thus, the content addressable memory 900 according to the comparative example of FIG. 14 needs to control a timing for assertion of the search line enable signal SLE and a timing for assertion of the match line precharge signal MLPRE_N by the delay stages 951 and 952. Since the delay times of the delay stages 951 and 952 greatly change due to variations in the manufacture of each transistor and fluctuations in power supply voltage and operating temperature, it takes time to perform a timing adjustment. In particular it becomes difficult to ensure a precharge period for each match line ML as an operating frequency becomes faster.

[Configuration Example of Control Signal Line]

Figure 16:
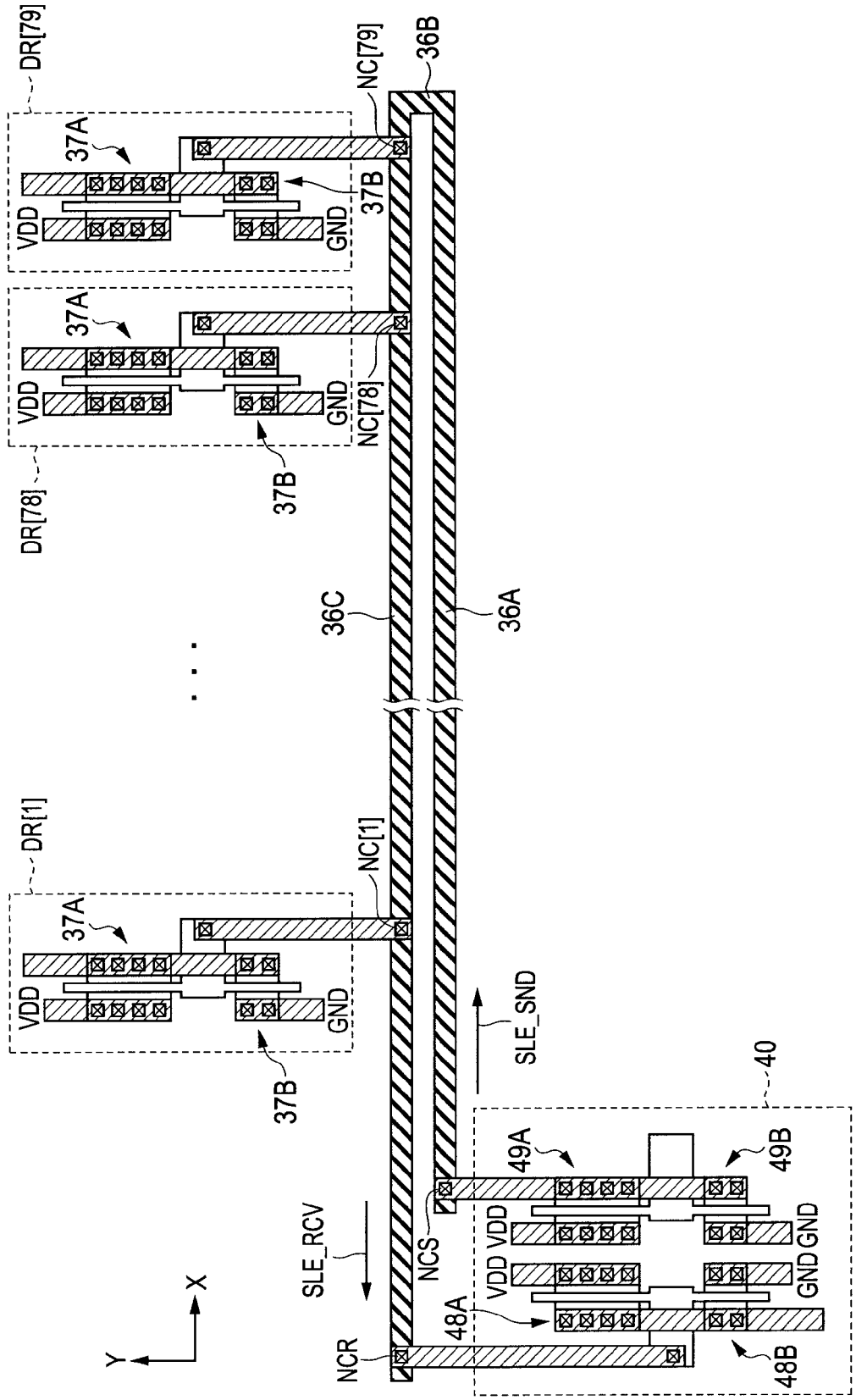
FIG. 16 is a plan diagram illustrating one example of a configuration of a control signal line 36 shown in FIG. 2.

FIG. 16 is a plan diagram showing one example of a configuration of the control signal line 36 shown in FIG. 2. In order to facilitate graphical illustration, some wirings are shown hatched in FIG. 16.

As shown in FIG. 16, the control signal line 36 is comprised of a wiring portion 36A, a return portion 36B and a wiring portion 36C formed integrally with the same metal wiring layer.

An end on the −X-direction side, of the wiring portion 36A is coupled via a contact NCS (coupling node) to last-stage transistors 49A and 49B of a unit for transmission of a search line enable signal SLE_SND, which are provided in the search control circuit 40.

The wiring portion 36C is first coupled to transistors 37A and 37B of input first stages in the search line driver DR [79] via a contact NC [79] (coupling node) as viewed from the return portion 36B. The wiring portion 36C is subsequently coupled to transistors 37A and 37B of input first stages in the respective search line drivers DR via contacts NC [78] through NC [1] (coupling node) in the arrangement order of the search line drivers DR. Finally, an end on the −X-direction side, of the wiring portion 36C is coupled via a contact NCR (coupling node) to transistors 48A and 48B of input first stages in a unit for reception of a search line enable signal SLE_RCV, which transistors are provided in the search control circuit 40.

As described above, the search control circuit 40 is disposed at one end (end on the −X-direction side) of the memory cell array 10 as viewed in a first direction (X direction) in FIG. 16. The control signal wiring 36 has a first wiring portion 36C, a second wiring portion 36A and a return wiring portion 36B. The first and second wiring portions 36C and 36A extend from one end (end on the −X-direction side) of the memory cell array 10 as viewed in the first direction (X direction) to the other end (end on the +X-direction side) thereof and are disposed side by side in a second direction (Y direction). The return wiring portion 36B is located at the other end (end on the +X-direction side) of the memory cell array 10 as viewed in the first direction (X direction). Both ends of the first wiring portion 36C are respectively coupled to the search control circuit 40 and the return wiring portion 36B. Both ends of the second wiring portion 36A are respectively coupled to the search control circuit 40 and the return wiring portion 36B. The plural search line drivers DR are coupled to the first wiring portion 36C.

[Another Configuration Example of Control Signal Line]

Figure 17:
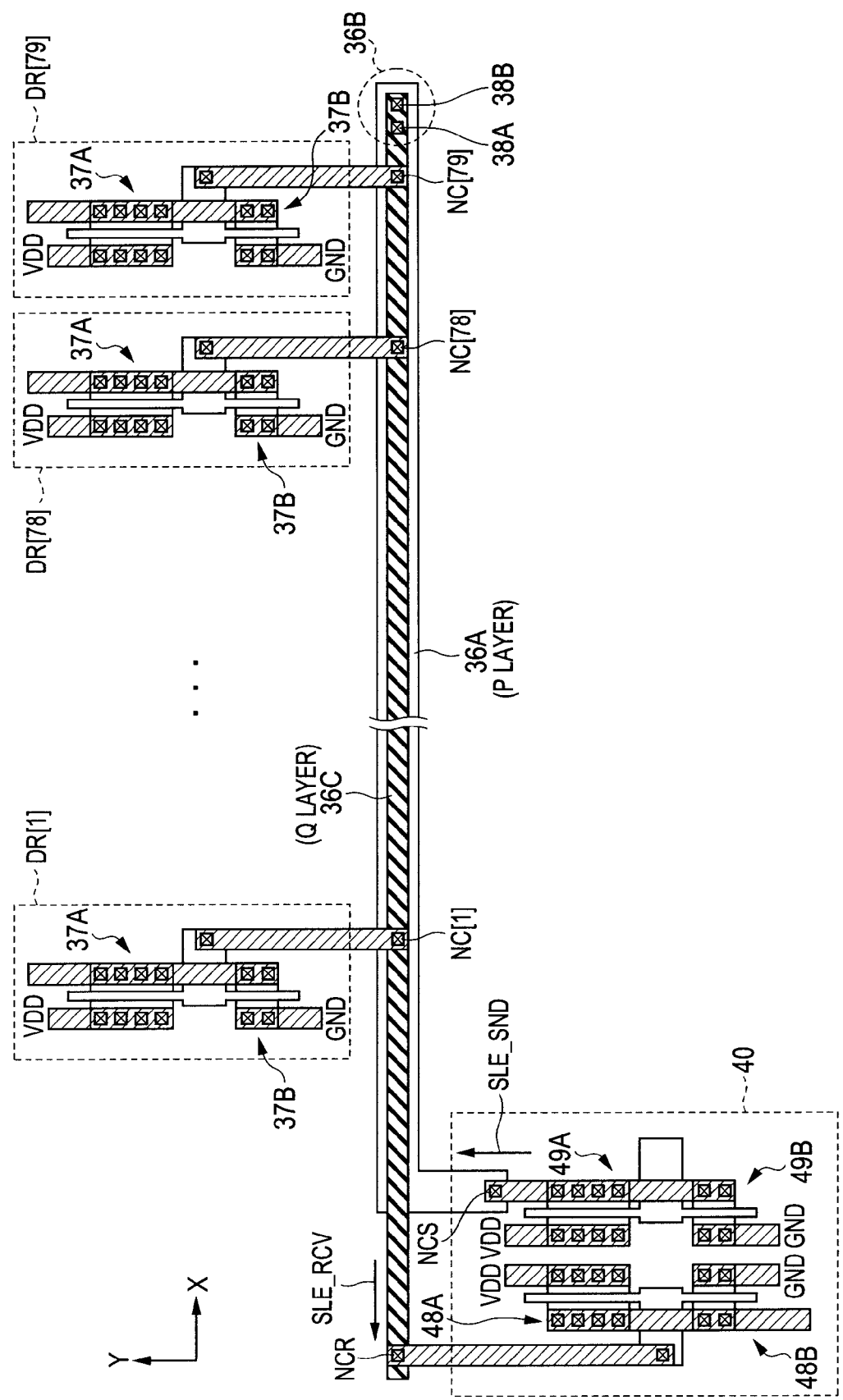
FIG. 17 is a plan diagram depicting another example of the configuration of the control signal line 36 shown in FIG. 2.

FIG. 17 is a plan diagram showing another example of the configuration of the control signal line 36 shown in FIG. 2. Some wirings are hatched in FIG. 17 to facilitate graphical illustration.

As shown in FIG. 17, the control signal line 36 includes a wiring portion 36A formed in a metal wiring layer corresponding to a Pth layer, a wiring portion 36C formed in a metal wiring layer corresponding to a Qth layer located above the Pth layer, and contact holes 38A and 38B that couple an end on the +X-direction side, of the wiring portion 36A and an end on the +X-direction side, of the wiring portion 36C. The contact holes 38A and 38B correspond to a return portion 36B at which a search line enable signal SLE is turned back.

An end on the −X-direction side, of the wiring portion 36A is coupled via a contact NCS (coupling node) to last-stage transistors 49A and 49B of a unit for transmission of a search line enable signal SLE_SND, which are provided in the search control circuit 40.

The wiring portion 36C is first coupled to transistors 37A and 37B of input first stages in a search line driver DR [79] via a contact NC [79] as viewed from the contact holes 38A and 38B. Subsequently, the wiring portion 36C is coupled to transistors 37A and 37B of input first stages in the respective search line drivers DR via contacts NC [78] through NC [1] (coupling node) in the arrangement order of the search line drivers DR. Finally, an end on the −X-direction side, of the wiring portion 36C is coupled via a contact NCR (coupling node) to transistors 48A and 48B of input first stages in a unit for reception of a search line enable signal SLE_RCV, which are provided in the search control circuit 40.

As described above, in FIG. 17, the first wiring portion 36C and the second wiring portion 36A are respectively disposed in the different wiring layers (Q layer and P layer) and coupled to each other via the contact holes 38A and 38B used as the return wiring portion 36B.

Second Embodiment

Configuration of Content Addressable Memory 100A

Figure 18:
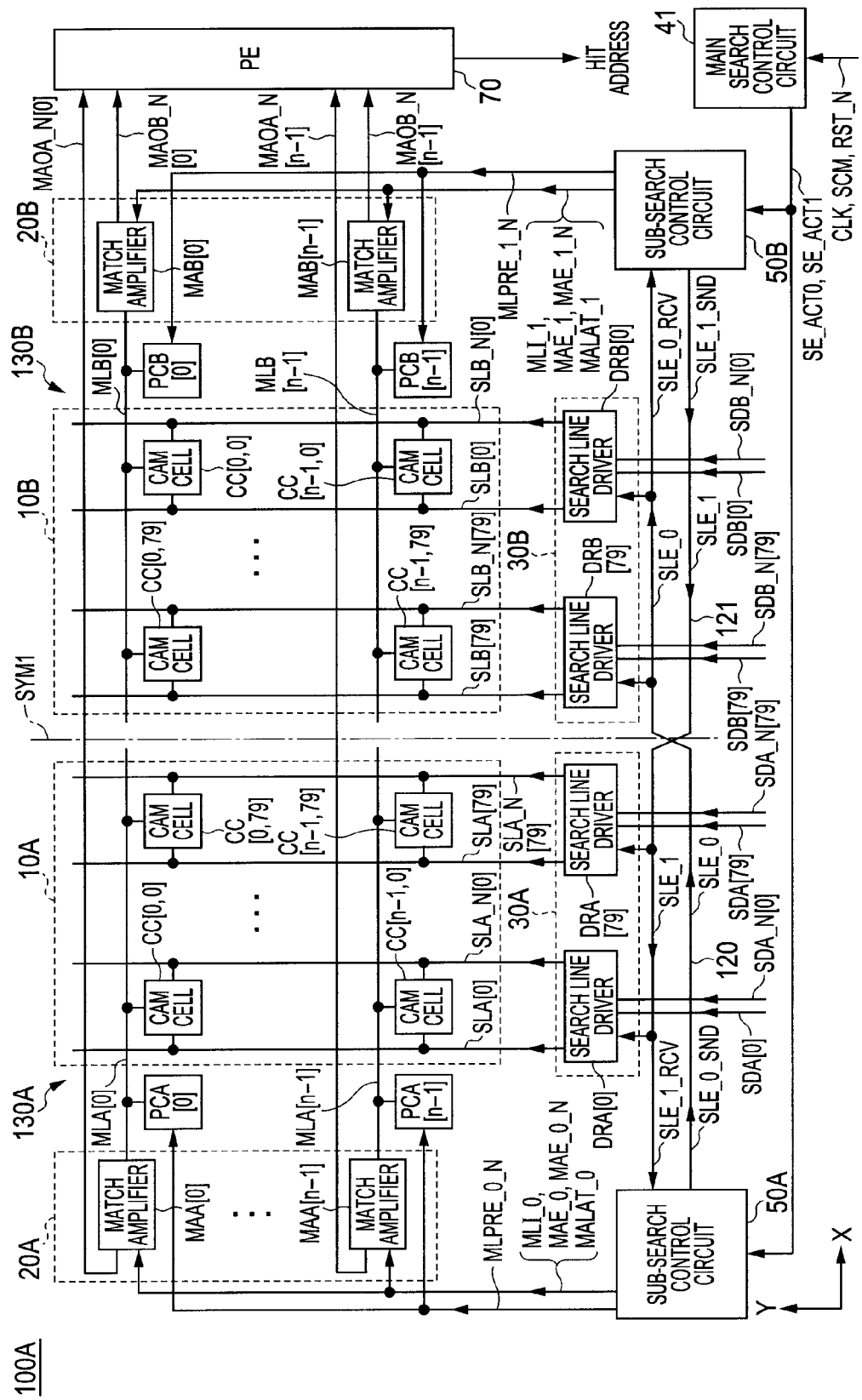
FIG. 18 is a block diagram showing a configuration of a content addressable memory 100A according to a second embodiment of the present invention.

FIG. 18 is a block diagram showing a configuration of a content addressable memory 100A according to a second embodiment of the present invention. The content addressable memory 100A shown in FIG. 18 is one in which some layouts of the configuration of the content addressable memory described in FIG. 1 are shown.

The content addressable memory 100A is different from the content addressable memory 100 of FIG. 2 in that a CAM memory array 10 is divided into first and second memory blocks 10A and 10B. Each of the memory blocks 10A and 10B includes CAM cells CC [0, 0] through CC [n−1, m−1] arranged in n rows and m columns (where m=80). The memory blocks 10A and 10B are disposed symmetrically to each other on both sides of a virtual line SYM1 (line of symmetry) extending in a Y direction. At the respective memory blocks 10A and 10B, column numbers of the columns farthest from the virtual line SYM1 are assumed to be 0 and column numbers of the columns nearest the virtual line SYM1 are assumed to be 79.

Each of the memory blocks 10A and 10B is provided with n match lines ML [0] through [n−1] extending in an X direction individually corresponding to the respective rows, and m match line pairs SL [0] and SL_N [0] through SL [m−1] and SL_N [m−1] (where m=80) extending in the Y direction individually corresponding to the respective columns. Subsequently, the match lines and the search line pairs corresponding to the memory block 10A are respectively described as match lines MLA and search line pairs SLA and SLA_N, and the match lines and the search line pairs corresponding to the memory block 10B are respectively described as match lines MLB and search line pairs SLB and SLB_N. The match lines MLA and search line pairs SLA and SLA_N provided corresponding to the memory block 10A, and the match lines MLB and search line pairs SLB and SLB_N provided corresponding to the memory block 10B are disposed symmetrically to each other with respect to the virtual line SYM1.

Further, as shown in FIG. 18, the content addressable memory 100A includes a match detection unit 20A, a search data transfer unit 30A and first precharge units PCA [0] through PCA [n−1] provided corresponding to the first memory block 10A, and a match detection unit 20B, a search data transfer unit 30B and second precharge units PCB [0] through PCB [n−1] provided corresponding to the second memory block 10B.

The match detection unit 20A includes match amplifiers MAA [0] through MAA [n−1] individually provided at ends lying on the side farther away from the symmetric line SYM1, of both ends of the respective match lines MLA [0] through MLA [n−1]. Since the respective match amplifiers MAA are identical in configuration to those employed in the first embodiment, their description will not be repeated. Match amplifiers MAB [0] through MAB [n−1] that configure the match detection unit 20B are also similar to the above. The match amplifiers MAA of the match detection unit 20A and the match amplifiers MAB of the match detection unit 20B are disposed symmetrically to each other with respect to the virtual line SYM1.

The search data transfer unit 30A includes search line drivers DRA [0] through DRA [79] respectively provided at ends of the search line pairs SLA [0] and SLA_N [0] through SLA [79] and SLA_N [79] lying on the −Y-direction side. Since the search line drivers DRA are identical in configuration to those employed in the first embodiment, their description will not be repeated. Search line drivers DRB [0] through DRB [79] that configure the search data transfer unit 30B are also similar to the above. The search line drivers DRA of the search data transfer unit 30A and the search line drivers DRB of the search data transfer unit 30B are disposed symmetrically to each other with respect to the virtual line SYM1.

A first memory unit 130A of the present invention comprises the first memory block 10A, and the match lines MLA, search line pairs SLA and SLA_N, match detection unit 20A and search data transfer unit 30A corresponding to the first memory block 10A. Similarly, a second memory unit 130B of the present invention comprises the second memory block 10B, and the match lines MLB, search line pairs SLB and SLB_N, match detection unit 20B and search data transfer unit 30B corresponding to the second memory block 10B. The first and second memory units 130A and 130B are disposed symmetrically to each other with respect to the virtual line SYM1.

The first precharge units PCA [0] through PCA [n−1] are respectively provided corresponding to the match lines MLA [0] through MLA [n−1] provided at the memory block 10A. The first precharge units PCA [0] through PCA [n−1] are respectively coupled to ends of the match lines MLA lying on the side close to the match detection unit 20A (match amplifiers MAA).

Similarly, the second precharge units PCB [0] through PCB [n−1] are respectively provided corresponding to the match lines MLB [0] through MLB [n−1] provided at the memory block 10B. The second precharge units PCB [0] through PCB [n−1] are respectively coupled to ends of the match lines MLB lying on the side close to the match detection unit 20B (match amplifiers MAB). Since the first and second precharge units PCA and PCB are identical in configuration to the precharge units PC employed in the first embodiment, their description will not be repeated.

Further, the content addressable memory 100A includes a sub-search control circuit 50A provided on the same side as the first memory block 10A with respect to the virtual line SYM1, and a sub-search control circuit 50B provided on the same side as the second memory block 10B with respect to the virtual line SYM1. The sub-search control circuit 50A and the sub-search control circuit 50B are disposed symmetrically to each other with respect to the virtual line SYM1. In FIG. 18, the distance between each of the sub-search control circuits 50A and 50B and the virtual line SYM1 is approximately equal to the distance between each of the match detection units 20A and 20B and the virtual line SYM1.

The sub-search control circuit 50A (second control unit) supplies a search line enable signal SLE_0 (second control signal) to each search line driver DRB of the search data transfer unit 30B lying on the opposite side with the virtual line SYM1 interposed therebetween. When the received search line enable signal SLE_0 is asserted, each of the search line drivers DRB of the search data transfer unit 30B transfers search data SDB and SDB_N to each CAM cell CC coupled to the corresponding search line pair SLB and SLB_N.

Similarly, the sub-search control circuit 50B (first control unit) supplies a search line enable signal SLE_1 (first control signal) to each search line driver DRA of the search data transfer unit 30A lying on the opposite side with the virtual line SYM1 interposed therebetween. When the received search line enable signal SLE_1 is asserted, each of the search line drivers DRA of the search data transfer unit 30A transfers search data SDA and SDA_N to each CAM cell CC coupled to the corresponding search line pair SLA and SLA_N.

The sub-search control circuit 50A (second control unit) further receives the search line enable signal SLE_1 (first control signal) from the sub-search control circuit 50B (first control unit) lying on the opposite side with the virtual line SYM1 interposed therebetween. The sub-search control circuit 50A generates match amplifier control signals MLI_0, MAE_0 and MALAT_0 (fourth control signal) and a match line precharge signal MLPRE_0_N (sixth control signal)

using the search line enable signal SLE_1. The generated match amplifier control signals MLI_0, MAE_0 and MALAT_0 and match line precharge signal MLPRE_0_N are respectively outputted to the respective match amplifiers MAA of the match detection unit 20A and the first precharge units PCA [0] through PCA [n−1] lying on the same side as the sub-search control circuit 50A with respect to the virtual line SYM1. When the received match amplifier control signals MLI_0, MAE_0 and MALAT_0 are asserted, the respective match amplifiers MAA of the match detection unit 20A detect logic levels of their corresponding match lines MLA. When the received match line precharge signal MLPRE_0_N is asserted, the first precharge units PCA [0] through PCA [n−1] apply a predetermined voltage (power supply voltage) to their corresponding match lines MLA.

Similarly, the sub-search control circuit 50B (first control unit) further receives the search line enable signal SLE_0 (second control signal) from the sub-search control circuit 50A (second control unit) lying on the opposite side with the virtual line SYM1 interposed therebetween. The sub-search control circuit 50B generates match amplifier control signals MLI_1, MAE_1 and MALAT_1 (third control signal) and a match line precharge signal MLPRE_1_N (fifth control signal) using the search line enable signal SLE_0. The generated match amplifier control signals MLI_1, MAE_1 and MALAT_1 and match line precharge signal MLPRE_1_N are respectively outputted to the respective match amplifiers MAB of the match detection unit 20B and the second precharge units PCB [0] through PCB [n−1] lying on the same side as the sub-search control circuit 50B with respect to the virtual line SYM1. When the received match amplifier control signals MLI_1, MAE_1 and MALAT_1 are asserted, the respective match amplifiers MAB of the match detection unit 20B detect logic levels of their corresponding match lines MLB. When the received match line precharge signal MLPRE_1_N is asserted, the second precharge units PCB [0] through PCB [n−1] apply a predetermined voltage (power supply voltage) to their corresponding match lines MLB.

As shown in FIG. 18, there is provided a control signal line 120 (second control signal line) to transmit the search line enable signal SLE_0 from the sub-search control circuit 50A to the search data transfer unit 30B and the sub-search control circuit 50B. Further, a control signal line 121 (first control signal line) is provided to transmit the search line enable signal SLE_1 from the sub-search control circuit 50B to the search data transfer unit 30A and the sub-search control circuit 50A.

The control signal line 120 extends approximately in the +X direction from the sub-search control circuit 50A, and intersects with the virtual line SYM1 and reaches the sub-search control circuit 50B lying on the opposite side thereof. The control signal line 120 is coupled to the search line drivers DRB of the search data transfer unit 30B in the arrangement order of the search line drivers DRB (DRB [79] through DRB [0]). Thus, the search line enable signal SLE_0 outputted from the sub-search control circuit 50A reaches the search line drivers DRB of the search data transfer unit 30B in the order from the side close to the virtual line SYM1.

The control signal line 121 extends approximately in the −X direction from the sub-search control circuit 50B. The control signal line 121 intersects with the virtual line SYM1 and reaches the sub-search control circuit 50A lying on the opposite side thereof. The control signal line 121 is coupled to the search line drivers DRA of the search data transfer unit 30A in the arrangement order of the search line drivers DRA (DRA [79] through DRA [0]). Thus, the search line enable signal SLE_1 outputted from the sub-search control circuit 50B reaches the search line drivers DRA of the search data transfer unit 30A in the order from the side close to the virtual line SYM1.

The control signal lines 120 and 121 are laid out approximately symmetrically to each other with respect to the virtual line SYM1. The length of a transmission path for the search line enable signal SLE_1, which extends to an arbitrary first search line driver DRA of the search data transfer unit 30A with the sub-search control circuit 50B as a starting point, is equal to the length of a transmission path for the search line enable signal SLE_0, which extends to a second search line driver DRB disposed symmetrically with the first search line driver DRA with respect to the virtual line SYM1 with the sub-search control circuit 50A as a starting point. Further, the length of a transmission path for the search line enable signal SLE_0, which extends from the sub-search control circuit 50A to the sub-search control circuit 50B, is equal to the length of a transmission path for the search line enable signal SLE_1, which extends from the sub-search control circuit 50B to the sub-search control signal 50A. Thus, when the thicknesses and widths of the control signal lines 120 and 121 are formed equal to each other, signal transmission times are also equal to each other.

The content addressable memory 100A further includes a priority encoder 70 and a main search control circuit 41 (third control unit) provided commonly to the first and second memory blocks 10A and 10B. The main search control circuit 41 outputs trigger signals SE_ACT1 and SE_ACT2 (seventh control signal) to the sub-search control circuits 50A and 50B.

The priority encoder 70 is provided on the same side (+X-direction side) as the second memory block 10B with respect to the virtual line SYM1. The priority encoder 70 receives detection results MAGO_N [0] through MAGO_N [n−1] of logic levels of the match lines MLA provided at the first memory block 10A from the match amplifiers MAA [0] through MAA [n−1] of the match detection unit 20A, respectively. Further, the priority encoder 70 receives detection results MAOB_N [0] through MAOB_N [n−1] of logic levels of the match lines MLB provided at the second memory block 10B from the match amplifiers MAB [0] through MAB [n−1] of the match detection unit 20B, respectively.

The main search control circuit 41 is provided at a position lying at a distance approximately equal to the priority encoder 70 as viewed from the virtual line SYM1 on the same side (+X-direction side) of the priority encoder 70 with respect to the virtual line SYM1. Further, as described above, the distance from each of the sub-search control circuits 50A and 50B to the virtual line SYM1 is approximately equal to the distance from each of the match detection units 20A and 20B to the virtual line SYM1.

Owing to such a layout, the length of a transmission path for each of the trigger signals SE_ACT1 and SE_ACT2, which extends from the main search control circuit 41 to the sub-search control circuit 50A, becomes approximately equal to the length of a transmission path for the result of detection, which extends from the match detection unit 20A to the priority encoder 70. Further, the length of a transmission path for the trigger signal SE_ACT1 and SE_ACT2, which extends from the main search control circuit 41 to the sub-search control circuit 50B, becomes approximately equal to the length of a transmission path for the result of detection, which extends from the match detection unit 20B to the priority encoder 70. Thus, when the wiring for transmitting each of the trigger signals SE_ACT1 and SE_ACT2 and the wiring for transmitting the result of detection by each of the match detection units 20A and 20B are formed equal to each other in thickness and width, the times taken to transmit both signals also become equal.

[Advantageous Effects of Content Addressable Memory 100A]

According to the content addressable memory 100A having the above configuration, the time taken for the search line enable signal SLE_0 outputted from the sub-search control circuit 50A to reach the first search line driver DRB [79] of the search data transfer unit 30B can be made longer than the time taken for the match line precharge signal MLPRE_0_N outputted from the sub-search control circuit 50A to reach any first precharge unit PCA. Similarly, the time taken for the search line enable signal SLE_1 outputted from the sub-search control circuit 50B to reach the first search line driver DRA [79] of the search data transfer unit 30A can be made longer than the time taken for the match line precharge signal MLPRE_1_N outputted from the sub-search control circuit 50B to reach any second precharge unit PCB. Thus, the activation of the search lines SLA, SLA_N, SLB and SLB_N can be performed even with respect to both of the first and second memory blocks 10A and 10B after the completion of the precharge of the match lines MLA and MLB by the precharge units PCA and PCB.

Further, the sub-search control circuit 50A can generate a match line precharge signal MLPRE_0_N and match amplifier control signals MLI_0, MAE_0 and MALAT_0 using the corresponding search line enable signal SLE_1_RCV received from the sub-search control circuit 50B. Similarly, the sub-search control circuit 50B can generate a match line precharge signal MLPRE_1_N and match amplifier control signals MLI_1, MAE_1 and MALAT_1 using the corresponding search line enable signal SLE_0_RCV received from the sub-search control circuit 50A. Thus, after the search lines SLA, SLA_N, SLB and SLB_N corresponding to the first and second memory blocks 10A and 10B have been brought to an inactive state, the match line precharge signals MLPRE_0_N and MLPRE_1_N and the match amplifier control signals MLI_0, MAE_0, MALAT_0, MLI_1, MAE_1 and MALAT_1 can be asserted easily.

Further, since the search lines SLA, SLA_N, SLB and SLB_N are activated in order from those far away from the corresponding match amplifiers MAA and MAB even with respect to both of the first and second memory blocks 10A and 10B, there is no need to consider wiring delays of the match lines MLA and MLB in order to determine the timings provided to activate the match amplifiers MAA and MAB.

Furthermore, according to the content addressable memory 100A having the above configuration, an access queue between the first and second memory blocks can be reduced. The reason for this will be explained below specifically.

When a data search for the first memory block 10A is first performed (first data search), the trigger signal SE_ACT1 being placed in the active state is transmitted from the main search control circuit 41 to the sub-search control circuit 50B. In response to it, the search line enable signal SLE_1 being placed in the active state is transmitted from the sub-search control circuit 50B to the respective search line drivers DRA of the search data transfer unit 30A. In response to it, the search data SDA and SDA_N are transferred from the search line drivers DRA of the search data transfer unit 30A to the respective CAM cells CC of the first memory block 10A. A change in the voltage of each match line MLA that occurs where the search data SDA and SDA_N and stored data are brought into mismatch, is detected by each of the match amplifiers MAA of the match detection unit 20A. Then, the result of detection is transmitted from each match amplifier MAA of the match detection unit 20A to the priority encoder 70.

Next, when a data search for the second memory block 10B is performed (second data search), the trigger signal SE_ACT1 being placed in the active state is transmitted from the main search control circuit 41 to the sub-search control circuit 50A. In response to it, the search line enable signal SLE_0 being placed in the active state is transmitted from the sub-search control circuit 50A to the respective search line drivers DRB of the search data transfer unit 30B. In response to it, the search data SDB and SDB_N are transferred from the search line drivers DRB of the search data transfer unit 30B to the respective CAM cells CC of the second memory block 10B. A change in the voltage of each match line MLB that occurs where the search data SDB and SDB_N and stored data are brought into mismatch, is detected by each of the match amplifiers MAB of the match detection unit 20B. Then, the result of detection is transmitted from each match amplifier MAB of the match detection unit 20B to the priority encoder 70.

When the first data search and the second data search are compared, the lengths of the transmission paths for the signals extending from the main search control circuit 41 to the priority encoder 70 become identical to each other. As a result, since the signal's transmission times can be made identical, variations in the output of the search result become smaller, and hence the content addressable memory can be operated at a frequency higher than conventional.

[Configurations of Sub-Search Control Circuits 50A and 50B]

Concrete configuration examples of the sub-search control circuits 50A and 50B will be explained below.

Figure 19:
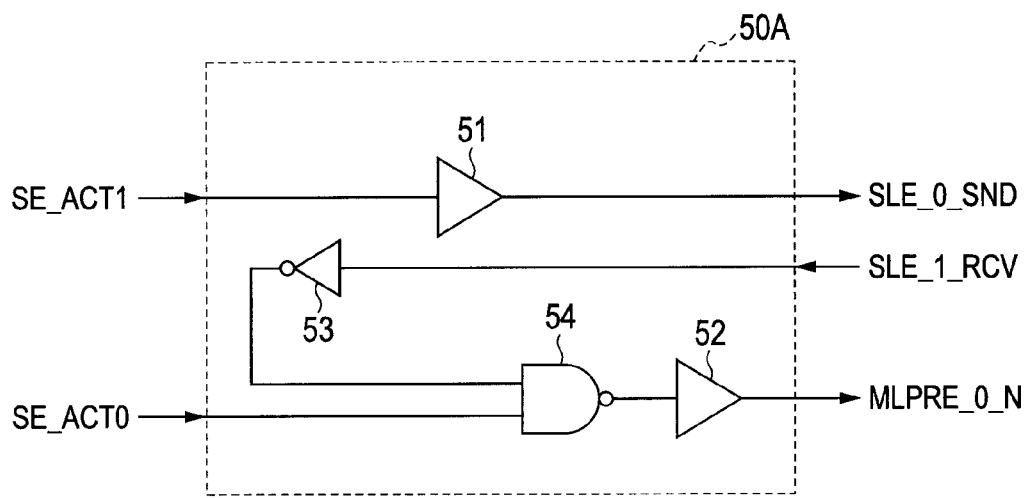
FIG. 19 is a block diagram illustrating a partial configuration of a sub-search control circuit 50A shown in FIG. 18 (generation of search line enable signal SLE_0 and match line precharge signal MLPRE_0_N)

FIG. 19 is a block diagram showing a partial configuration of the sub-search control circuit 50A shown in FIG. 18. FIG. 19 shows the configuration of the sub-search control circuit 50A related to the generation of the search line enable signal SLE_0 and match line precharge signal MLPRE_0_N. Since the sub-search control circuit 50A of FIG. 19 is identical to that of FIG. 9 in circuit's internal configuration, its description will not be repeated. The sub-search control circuit 50A shown in FIG. 19 generates a search line enable signal SLE_0_SND using the trigger signal SE_ACT1 for activation of the search lines SLB and SLB_N, received from the main search control circuit 41. Further, the sub-search control circuit 50A generates a match line precharge signal MLPRE_0_N using the trigger signal SE_ACT0 for precharge of the match line MLA and the search line enable signal SLE_1_RCV received from the sub-search control circuit 50B.

Figure 20:
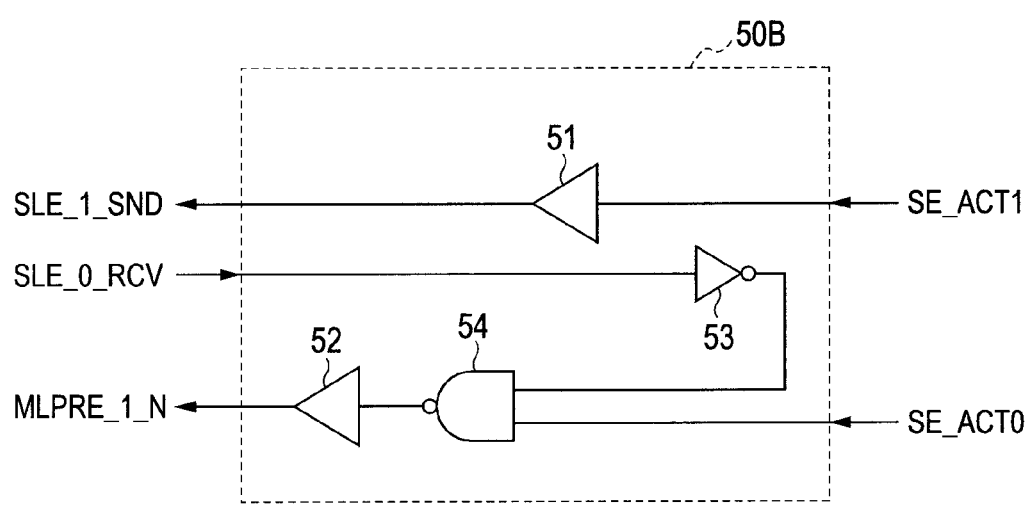
FIG. 20 is a block diagram showing a partial configuration of a sub-search control circuit 50B shown in FIG. 18 (generation of search line enable signal SLE_1 and match line precharge signal MLPRE_1_N)

FIG. 20 is a block diagram showing a partial configuration of the sub-search control circuit 50B shown in FIG. 18. FIG. 20 shows the configuration of the sub-search control circuit 50B related to the generation of the search line enable signal SLE_1 and match line precharge signal MLPRE_1_N. Since the sub-search control circuit shown in FIG. 20 is identical to that of FIG. 9 in circuit's internal configuration, its description will not be repeated. The sub-search control circuit 50B shown in FIG. 20 generates a search line enable signal SLE_1_SND using the trigger signal SE_ACT1 for activation of the search lines SLA and SLA_N, which has been received from the main search control circuit 41. Further, the sub-search control circuit 50B generates a match line precharge signal MLPRE_1_N using the trigger signal SE_ACT0 for precharge of the match line MLB and the search line enable signal SLE_0_RCV received from the sub-search control circuit 50A.

Figure 21:
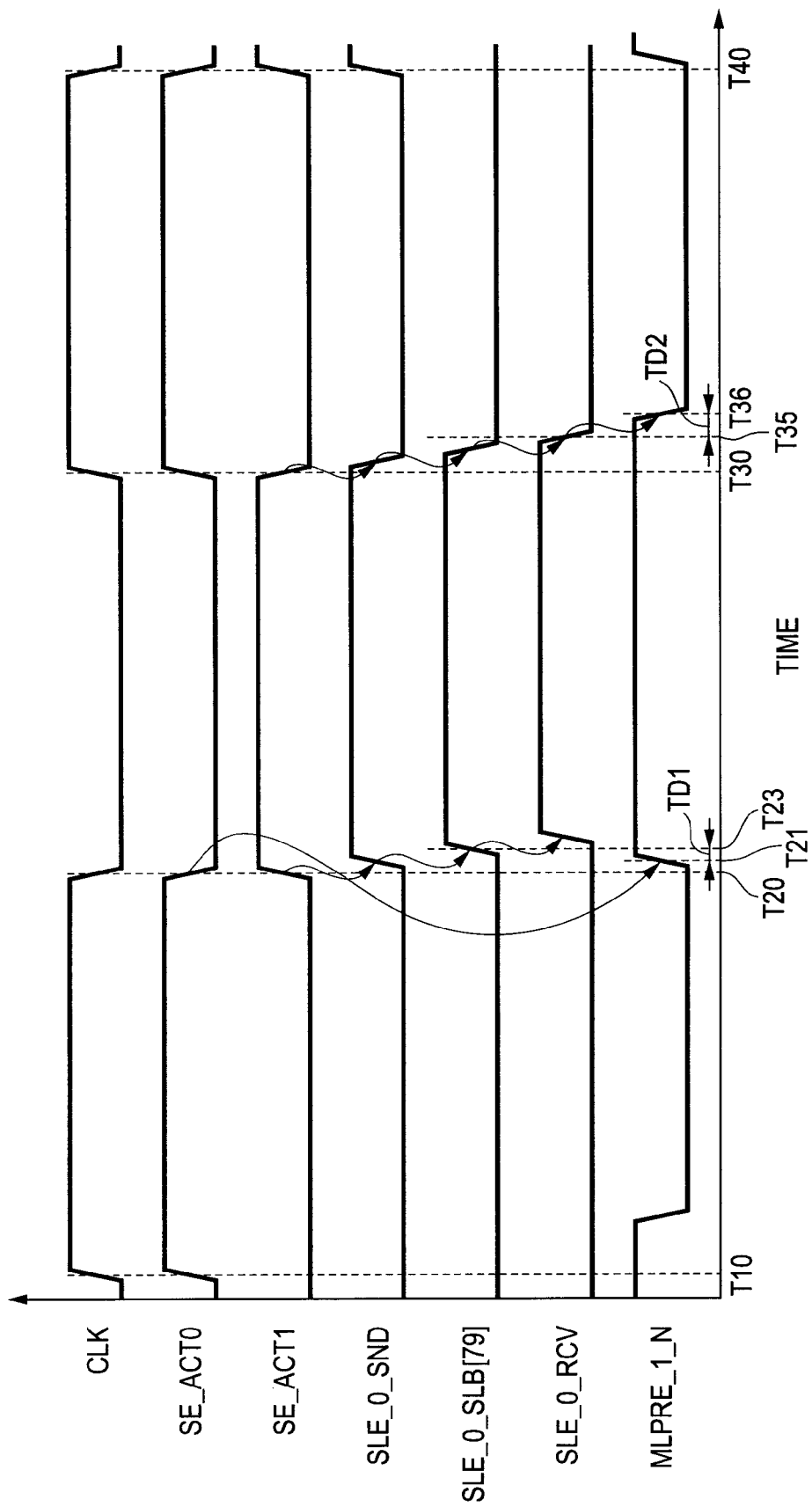
FIG. 21 is a timing diagram for explaining the respective signals shown in FIGS. 19 and 20.

FIG. 21 is a timing diagram for explaining the respective signals shown in FIG. 19 and FIG. 20. FIG. 21 shown, in order from above, waveforms of the clock CLK, trigger signals SE_ACT0 and SE_ACT1, search line enable signal SLE_0_SND at the transmission thereof by the sub-search control circuit 50A, search line enable signal SLE_0 SLB [79] that has reached the search line driver DRB [79] of the search data transfer unit 30B, search line enable signal SLE_0_RCV at the reception thereof by the sub-search control circuit 50B, and match line precharge signal MLPRE_1_N. The clock CLK is assumed to rise at timings of times T10 and T30 and fall at timings of times T20 and T40.

As shown in FIG. 21, the trigger signal SE_ACT0 for the precharge of the match lines MLB changes to an L level at the time T20. In response to it, the match line precharge signal MLPRE_1_N outputted from the sub-search control circuit 50B changes to an H level at a time T21, thereby leading to the completion of the precharge of the corresponding match line MLB corresponding to the second memory block 10B.

Further, at the time T20, the trigger signal SE_ACT1 for activation of the search lines SLB and SLB_N changes to an H level. In response to it, the search line enable signal SLE_0_SND transmitted from the sub-search control circuit 50A changes to an H level. At a time T23 that lags by a wiring delay from the assertion of the search line enable signal SLE_0 SND, the search line enable signal SLE_0 SLB [79] received from the search line driver DRB [79] of the search data transfer unit 30B is asserted. Further, the search line enable signal SLE_0_RCV received from the sub-search control circuit 50B is asserted with being delayed by the wiring delay.

Thus, at the second memory block 10B, a time margin TD1 can be provided between the time T21 at which the precharge of each match line MLB is completed and the time T23 at which the first search lines SLB [79] and SLB_N [79] are activated.

Next, at the time T30, the trigger signal SE_ACT0 for the precharge of the match line MLB changes to an H level. Further, the search line enable signal SLE_0_RCV received at the sub-search control circuit 50B is brought to an L level so that the match line precharge signal MLPRE_1_N outputted from the sub-search control circuit 50B is asserted (time T36). As a result, at the second memory block 10B, a time margin TD2 can be provided between a time T35 at which the deactivation of all the search line pairs SLB and SLB_N has been completed, and the time T36 at which the match line precharge signal MLPRE_1_N is asserted. While the above description has been made of the second memory block 10B, the first memory block 10A is also similar to the above.

Figure 22:
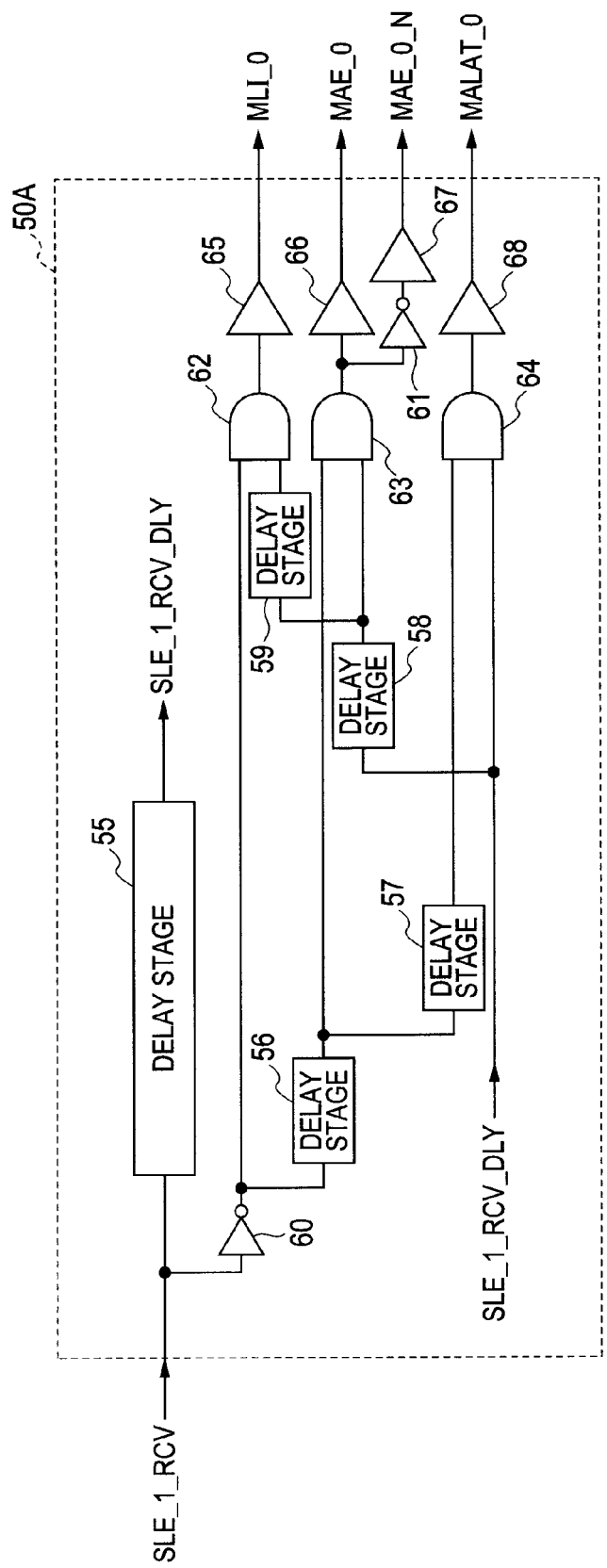
FIG. 22 is a block diagram showing a partial configuration of the sub-search control circuit 50A shown in FIG. 18 (generation of match amplifier control signal MAE_0 and the like)

FIG. 22 is a block diagram showing a partial configuration of the sub-search control circuit 50A shown in FIG. 18. FIG. 22 shows the configuration of the sub-search control circuit 50A related to the generation of match amplifier control signals MLI_0, MAE_0 and MALAT_0. Since the sub-search control circuit 50A shown in FIG. 22 is identical in circuit's internal configuration to that shown in FIG. 11, its description will not be repeated. The sub-search control circuit 50A generates the match amplifier control signals MLI_0, MAE_0, MAE_0_N and MALAT_0 using the search line enable signal SLE_1_RCV received from the sub-search control circuit 50B.

Figure 23:
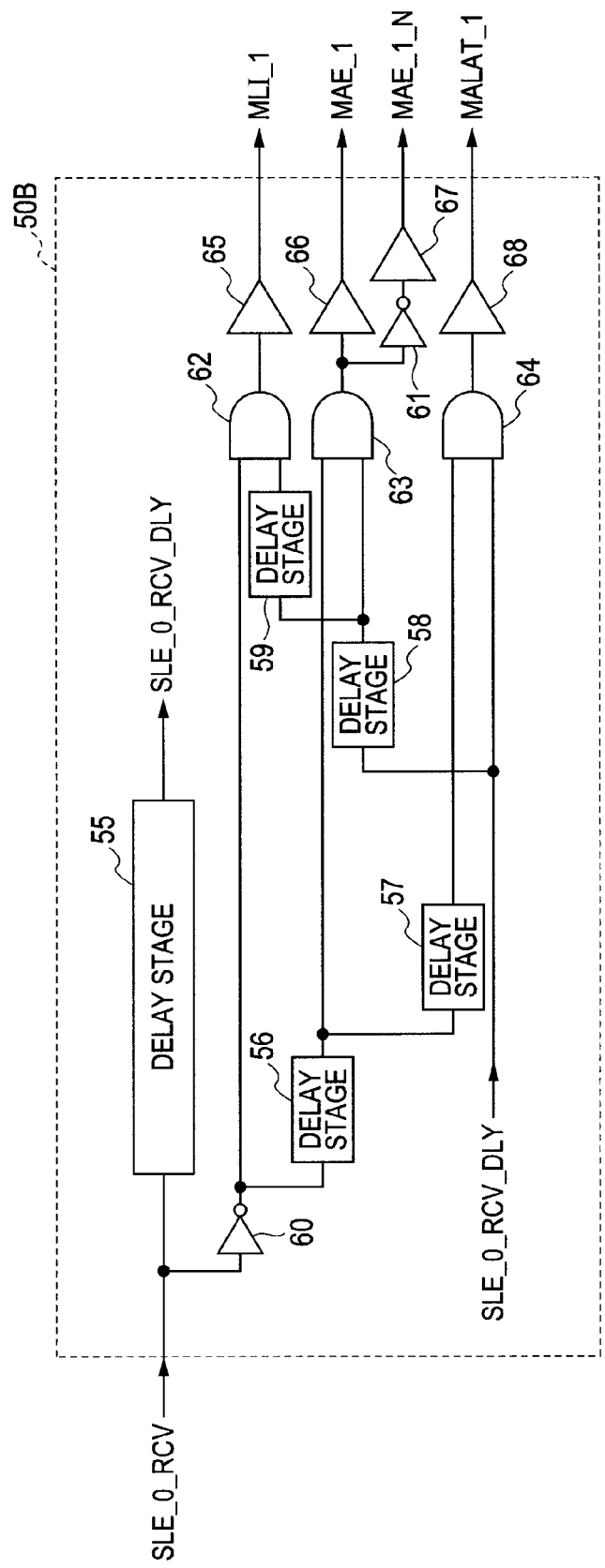
FIG. 23 is a block diagram showing a partial configuration of the sub-search control circuit 50B shown in FIG. 18 (generation of match amplifier control signal MAE_1 and the like)

FIG. 23 is a block diagram showing a partial configuration of the sub-search control circuit 50B shown in FIG. 18. FIG. 23 shows the configuration of the sub-search control circuit 50B related to the generation of match amplifier control signals MLI_1, MAE_1 and MALAT_1. Since the sub-search control circuit 50B is identical in circuit's internal configuration to that of FIG. 11, its description will not be repeated. The sub-search control circuit 50B generates the match amplifier control signals MLI_1, MAE_1 and MALAT_1 using the search line enable signal SLE_0_RCV received from the sub-search control circuit 50A.

Figure 24:
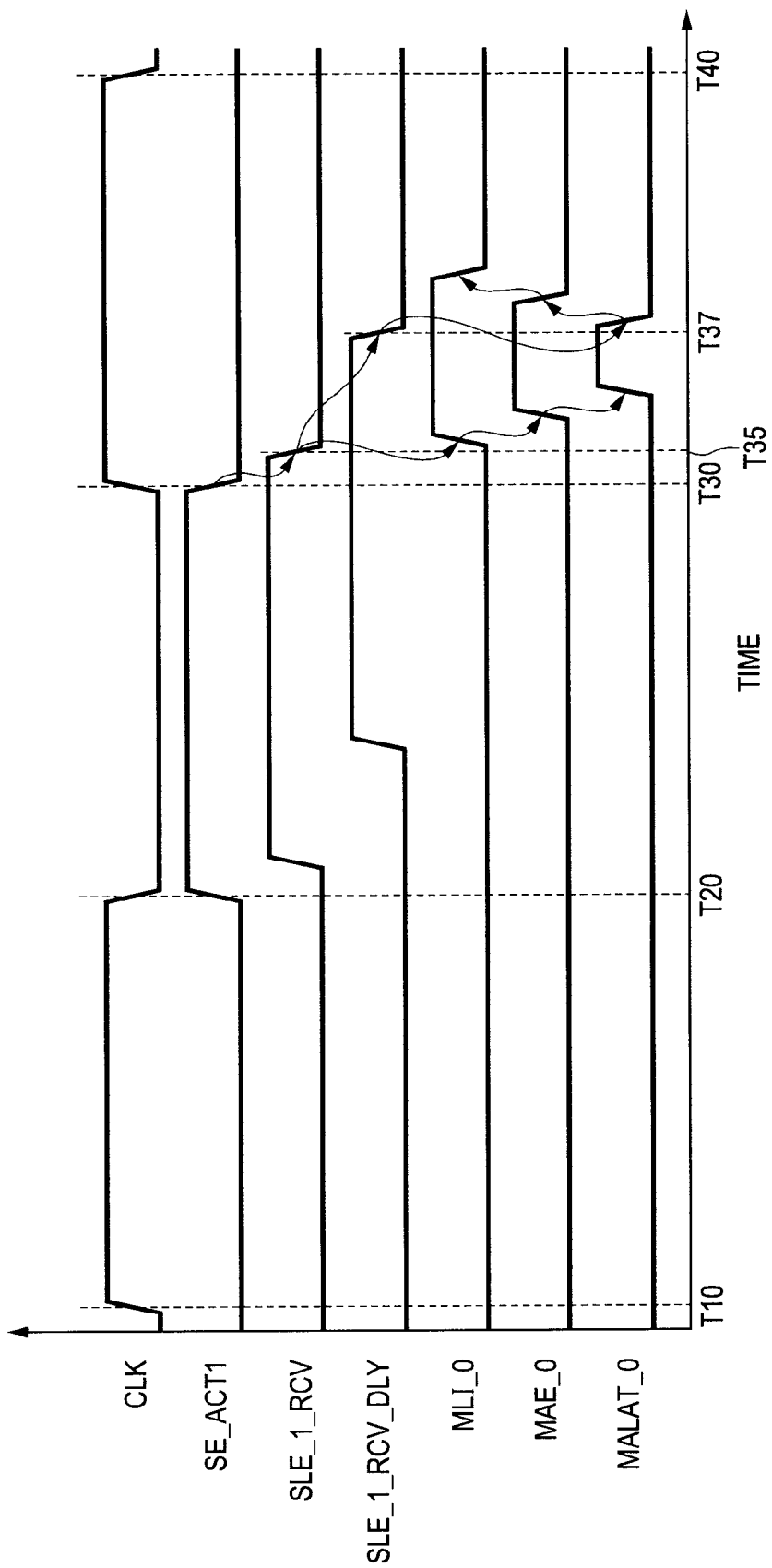
FIG. 24 is a timing diagram for explaining the respective signals shown in FIG. 22.

FIG. 24 is a timing diagram for describing the respective signals of FIG. 22. FIG. 24 shows, in order from above, waveforms of the clock CLK, trigger signal SE_ACT1, search line enable signal SLE_1_RCV received at the sub-search control circuit 50A, output signal SLE_1 RCV_DLY of a delay stage 55 of FIG. 22, and match amplifier control signals MLI_0, MAE_0 and MALAT_0. The clock CLK is assumed to rise at timings of times T10 and T30 and fall at timings of times T20 and T40.

As shown in FIG. 24, the trigger signal SE_ACT1 for the activation of the search lines SLA and SLA_N, which is outputted from the main search control circuit 41, changes to an L level at the time T30. In response to it, the search line enable signal SLE_1 outputted from the sub-search control circuit 50B changes to an L level. Therefore, the search line enable signal SLE_1_RCV received at the sub-search control circuit 50A changes to an L level at a time T35 that lags by a wiring delay. The match amplifier control signals MLI_0, MAE_0 and MALAT_0 respectively change to an H level in this order in response to the falling edge of the search line enable signal SLE_1_RCV.

Next, the output signal SLE_1 RCV_DLY of the delay stage 55 shown in FIG. 22 changes to an L level at a time T37 delayed by a predetermined delay time. The match amplifier control signals MALAT_0, MAE_0 and MLI_0 respectively change to an L level in this order in response to the falling edge of the output signal SLE_1 RCV_DLY of the delay stage 55.

[Configuration Example of Control Signal Line]

Figure 25:
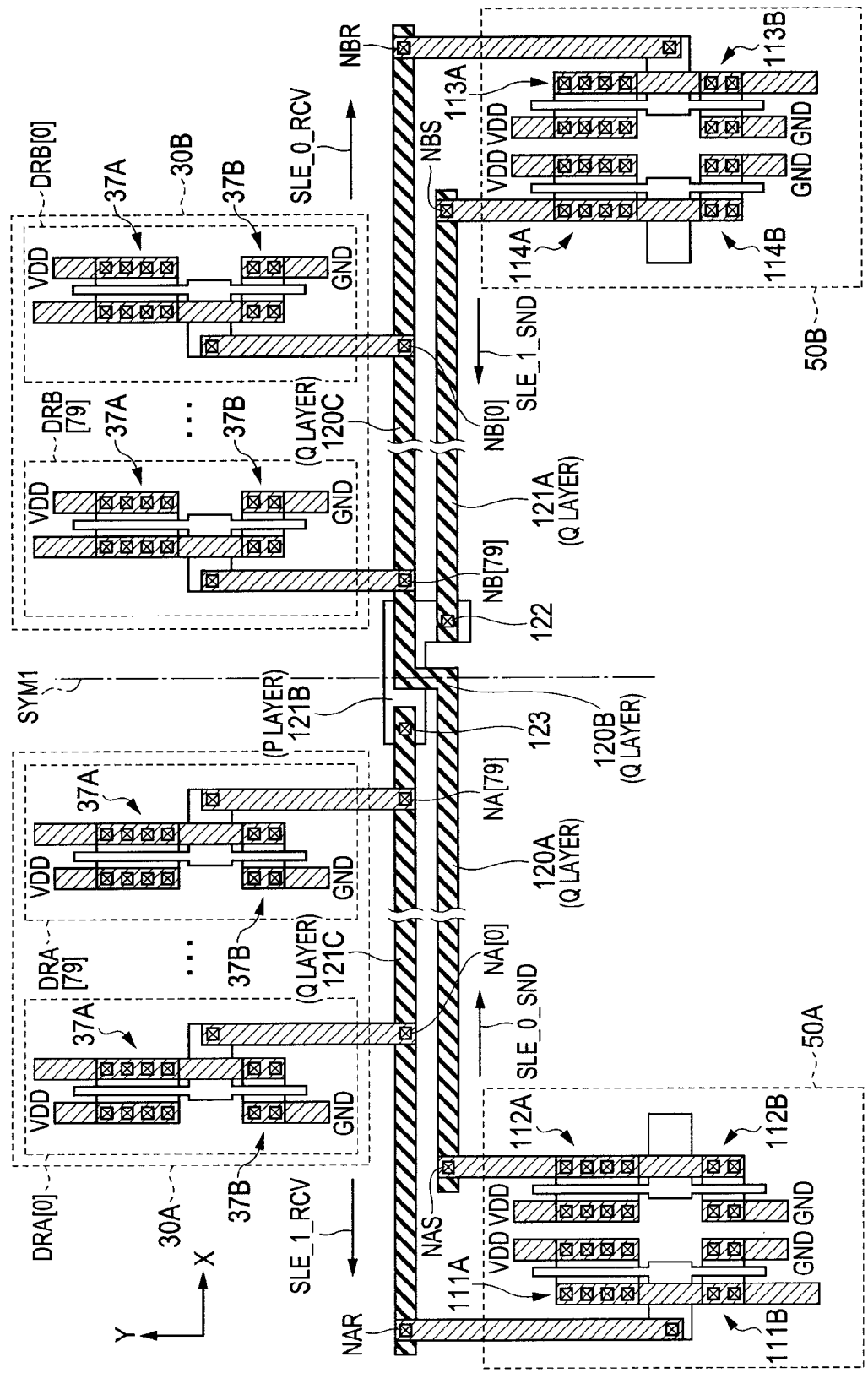
FIG. 25 is a plan diagram showing one example of configurations of control signal lines 120 and 121 shown in FIG. 18.

FIG. 25 is a plan diagram showing one example of the configurations of the control signal lines 120 and 121 shown in FIG. 18. In order to facilitate graphical illustration, some wirings are shown hatched in FIG. 25.

As shown in FIG. 25, the control signal line 120 includes wiring portions 120A through 120C formed integrally with a metal wiring layer corresponding to a Qth layer. An end on the −X-direction side, of the wiring portion 120A is coupled via a contact NAS to transistors 112A and 112B of a last stage in a unit for transmission of the search line enable signal SLE_0, which is provided at the sub-search control circuit 50A. The wiring portion 120A extends in the +X direction from the contact NAS. An end on the +X-direction side, of the wiring portion 120A is coupled to one end of the wiring portion 120B extending in the Y direction. The wiring portion 120C extends in the +X direction from the other end of the wiring portion 120B. An end on the +X-direction side, of the wiring portion 120C is coupled via a contact NBR to transistors 113A and 113B of an input first stage in a unit for reception of the search line enable signal SLE_0, which is provided at the sub-search control circuit 50B.

The control signal line 121 includes wiring portions 121A and 121C formed in a metal wiring layer corresponding to a Qth layer located at the same layer as the control signal line 120, and an L-shaped wiring portion 121B formed in a metal wiring layer corresponding to a Pth layer located below the Qth layer. An end on the +X-direction side, of the wiring portion 121A is coupled via a contact NBS to transistors 114A and 114B of a last stage in a unit for transmission of the search line enable signal SLE_1, which is provided at the sub-search control circuit 50B. The wiring portion 121A extends in the −X direction from the contact NBS and is coupled to one end of the wiring portion 121B via a contact 122. The wiring portion 121C is coupled to the other end of the wiring portion 121B via a contact 123 and extends in the −X direction from the contact 123. An end on the −X-direction side, of the wiring portion 121C is coupled via a contact NAR to transistors 111A and 111B of an input first stage in a unit for reception of the search line enable signal SLE_1, which is provided at the sub-search control circuit 50A.

The wiring portion 121C of the control signal line 121 is provided closer to the search data transfer unit 30A than the wiring portion 120A of the control signal line 120. The wiring portion 121C is first coupled via a contact NA [79] (coupling node) to transistors 37A and 37B of an input first stage of the search line driver DRA [79] of the search data transfer unit 30A as viewed from the virtual line SYM1 side. Subsequently, the wiring portion 121C is coupled to transistors 37A and 37B of input first stages of the respective search line drivers DRA in the arrangement order of the search line drivers DRA and finally coupled to transistors 37A and 37B of an input first stage of the search line driver DRA [0] via a contact NA [0].

The wiring portion 120C of the control signal line 120 is provided closer to the search data transfer unit 30B than the wiring portion 121A of the control signal line 121. The wiring portion 120C is first coupled via a contact NB [79] to transistors 37A and 37B of an input first stage in the search line driver DRB [79] of the search data transfer unit 30B as viewed from the virtual line SYM1 side. Subsequently, the wiring portion 120C is coupled to transistors 37A and 37B of input first stages of the respective search line drivers DRB in the arrangement order of the search line drivers DRB and finally coupled to transistors 37A and 37B of an input first stage of the search line driver DRB [0] via a contact NB [0].

The above configurations of the control signal lines 120 and 121 shown in FIG. 25 are summarized as follows: Incidentally, the second memory unit 130B and the sub-search control circuit 50B are collectively referred to as a first block, and the first memory unit 130A and the sub-search control circuit 50A are collectively referred to as a second block. The first and second blocks are disposed side by side in the first direction (X direction).

The search control circuit (sub-search control circuit 50B) of the first block is disposed at one end (end on the +X-direction side) in the first direction (X direction) of the entire first and second blocks. The search control circuit (sub-search control circuit 50A) of the second block is disposed at the other end (end on the −X-direction side) in the first direction (X direction) of the entire first and second blocks.

The control signal lines 120 and 121 respectively include first through fourth wiring portions. The first wiring portion 120 (120A through 120C) extends in the first direction (X direction) and has both ends respectively coupled to the search control circuit 50B of the first block and the search control circuit 50A of the second block. The second wiring portion 121B is disposed between the first and second blocks. The third wiring portion 121A extends in the first direction (X direction). Both ends thereof are respectively coupled to the search control circuit 50B of the first block and the second wiring portion 121B. The fourth wiring portion 121C extends in the first direction and has both ends respectively coupled to the search control circuit 50A of the second block and the second wiring portion 121B.

Described more specifically, a plurality of search line drivers DRB of the first block are respectively coupled to the first wiring portion 120 (120C). A plurality of search line drivers DRA of the second block are respectively coupled to the fourth wiring portion 121C. The first, third and fourth wiring portions 120, 121A and 121C are disposed in a first wiring layer (Q layer), and the second wiring layer 121B is disposed in a second wiring layer (P layer) different from the first wiring layer (Q layer).

[Another Configuration Example of Control Signal Line]

Figure 26:
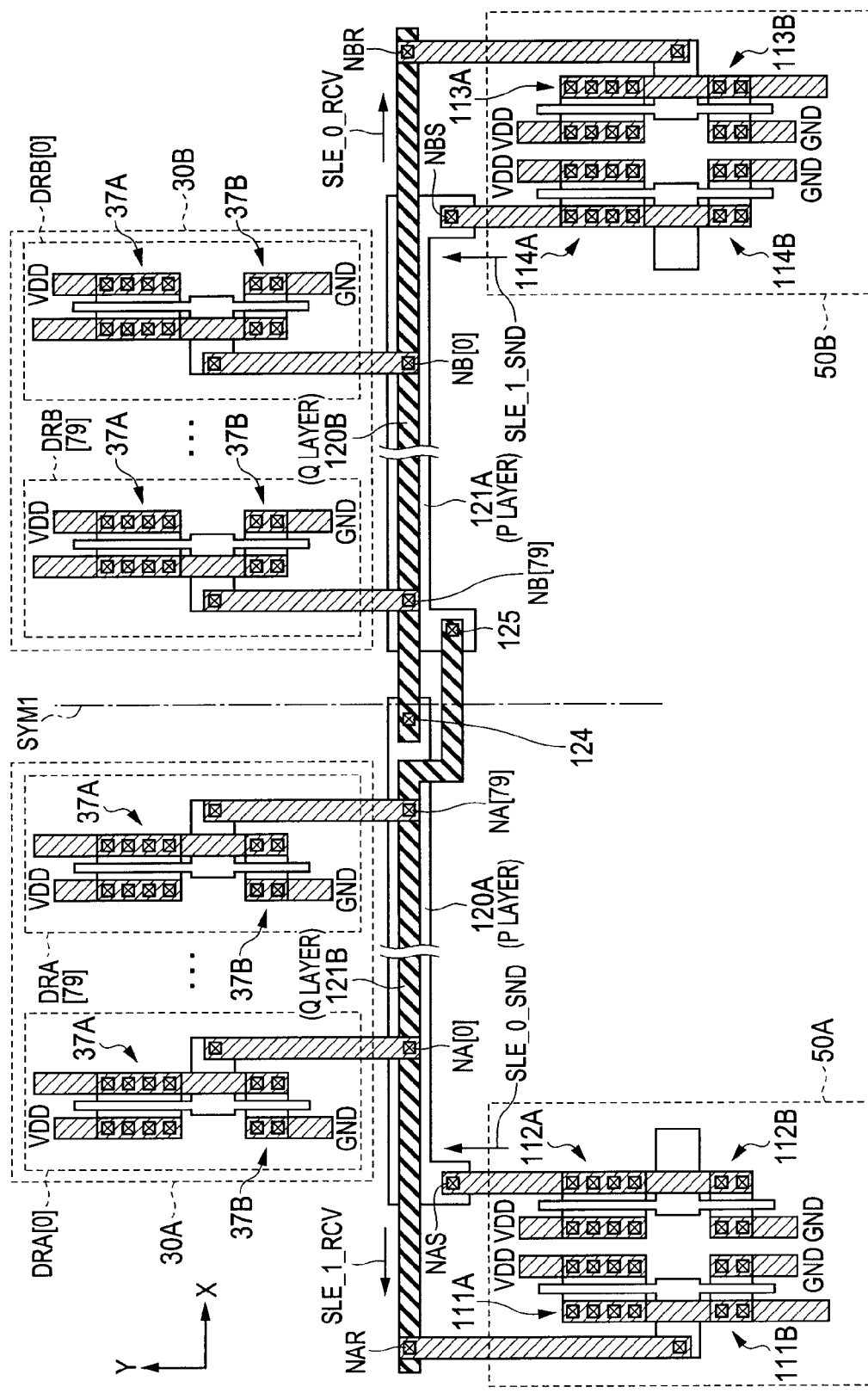
FIG. 26 is a plan diagram illustrating another example of the configurations of the control signal lines 120 and 121 shown in FIG. 18.

FIG. 26 is a plan diagram showing another example of the configurations of the control signal lines 120 and 121 of FIG. 18. Some wirings are hatched in FIG. 26 to facilitate graphical illustration.

As shown in FIG. 26, the control signal line 120 includes a wiring portion 120A formed in a metal wiring layer corresponding to a Pth layer, and a wiring portion 120B formed in a metal wiring layer corresponding to a Qth layer located above the Pth layer. The wiring portion 120A extends in an X direction except for an end on the −X-direction side. The end on the −X-direction side, of the wiring portion 120A is bent in an L-shaped fashion and coupled via a contact NA (coupling node) to transistors 112A and 112B of a last stage in a unit for transmission of the search line enable signal SLE_0, which is provided at the sub-search control circuit 50A. An end on the −X-direction side, of the wiring portion 120B is coupled via a contact 124 to an end on the +X-direction side, of the wiring portion 120A in the vicinity of the virtual line SYM1. The wiring portion 120B extends in the +X-direction from the contact 124. An end on the +X-direction side, of the wiring portion 120B is coupled via a contact NBR to transistors 113A and 113B of an input first stage in a unit for reception of the search line enable signal SLE_0, which is provided at the sub-search control circuit 50B.

The control signal line 121 includes a wiring portion 121A formed in a metal wiring layer corresponding to a Pth layer, and a wiring portion 121B formed in a metal wiring layer corresponding to a Qth layer located above the Pth layer. The wiring portion 121A extends in the X direction except for both ends bent in an L-shaped fashion. An end on the +X-direction side, of the wiring portion 121A is coupled via a contact NBS to transistors 114A and 114B of a last stage in a unit for transmission of the search line enable signal SLE_1, which is provided at the sub-search control circuit 50B. The wiring portion 121B extends in the X direction except for an end on the +X-direction side, which is bent twice in crank form. The end on the +X-direction side, of the wiring portion 121B is coupled via a contact 125 to an end on the −X-direction side, of the wiring portion 121A. An end on the −X-direction side, of the wiring portion 121C is coupled via a contact NAR to transistors 111A and 111B of an input first stage in a unit for reception of the search line enable signal SLE_1, which is provided at the sub-search control circuit 50A.

The wiring portion 120B of the control signal line 120 formed in the Qth layer is first coupled via a contact NB [79] to transistors 37A and 37B of an input first stage of the search line driver DRB [79] of the search data transfer unit 30B as viewed from the virtual line SYM1 side. Subsequently, the wiring portion 120B is coupled to transistors 37A and 37B of input first stages of the respective search line drivers DRB of the search data transfer unit 30B in the arrangement order of the search line drivers DRB. The wiring portion 120B is finally coupled via a contact NB [0] to transistors 37A and 37B of an input first stage of the search line driver DRB [0] of the search data transfer unit 30B.

The wiring portion 121B of the control signal line 120 formed in the Qth layer is first coupled via a contact NA [79] to transistors 37A and 37B of an input first stage of the search line driver DRA [79] of the search data transfer unit 30A as viewed from the virtual line SYM1 side. Subsequently, the wiring portion 121B is coupled to transistors 37A and 37B of input first stages of the respective search line drivers DRA of the search data transfer unit 30A in the arrangement order of the search line drivers DRA. The wiring portion 121B is finally coupled via a contact NA [0] to transistors 37A and 37B of an input first stage of the search line driver DRA [0] of the search data transfer unit 30A.

The above configurations of the control signal lines 120 and 121 shown in FIG. 26 are summarized as follows: Incidentally, subsequently, the second memory unit 130B and the sub-search control circuit 50B are collectively referred to as a first block, and the first memory unit 130A and the sub-search control circuit 50A are collectively referred to as a second block. The first and second blocks are disposed side by side in the first direction (X direction).

The search control circuit (sub-search control circuit 50B) of the first block is disposed at one end (end on the +X-direction side) in the first direction (X direction) of the entire first and second blocks. The search control circuit (sub-search control circuit 50A) of the second block is disposed at the other end (end on the −X-direction side) in the first direction (X direction) of the entire first and second blocks.

The control signal lines 120 and 121 respectively include first through fourth wiring portions. The first wiring portion 120B and the second wiring portion 121A extend in the first direction (X direction) and have one ends (ends on the +X-direction side) respectively coupled to the search control circuit 50B of the first block. The third wiring portion 121B and the fourth wiring portion 120A extend in the first direction (X direction) and have one ends (ends on the −X-direction side) respectively coupled to the search control circuit 50A of the second block. Each of the first and third wiring portions 120B and 121B is disposed in its corresponding first wiring layer (Q layer). Each of the second and fourth wiring portions 121A and 120A is disposed in its corresponding second wiring layer (P layer) different from the first wiring layer (Q layer). The other ends of the first and fourth wiring layers 120B and 120A are coupled to each other via the contact 124. The other ends of the second and third wiring portions 121A and 121B are coupled to each other via the contact 125.

Described more specifically, a plurality of search line drivers DRB of the first block are respectively coupled to the first wiring portion 120B. A plurality of search line drivers DRA of the second block are respectively coupled to the third wiring portion 121B.

It should be considered that the embodiments disclosed this time are intended to be illustrative and non-limiting in every respect. The scope of the present invention is not defined by the above description but by the scope of the claims. The scope of the present invention is intended to include all changes in the meaning and scope of the claims and equivalents.

What is claimed is:

1. A content addressable memory which compares search data inputted from outside and data stored in advance, comprising:
   a plurality of match lines disposed so as to extend in a first direction;
   a plurality of search lines disposed so as to extend in a second direction intersecting with the first direction;
   a memory cell array having a plurality of memory cells respectively disposed at points where the match lines and the search lines intersect;
   a plurality of search line drivers which are disposed every corresponding search line and drive the search lines according to the search data; and
   a search control circuit which transmits the search data to the search line drivers through a control signal wiring extending in the first direction,
   wherein the search control circuit is disposed at one end in the first direction, of the memory cell array,
   wherein the control signal wiring has:
      first and second wiring portions which extend from the one end in the first direction, of the memory cell array to the other end thereof and are disposed side by side in the second direction; and
      a return wiring portion disposed at the other end thereof,
   wherein both ends of the first wiring portion are respectively coupled to the search control circuit and the return wiring portion, and
   wherein both ends of the second wiring portion are respectively coupled to the search control circuit and the return wiring portion.

2. The content addressable memory according to claim 1, wherein the first wiring portion and the second wiring portion are respectively disposed in wiring layers different from each other, and
   wherein the first wiring portion and the second wiring portion are coupled to each other via the return wiring portion.

3. The content addressable memory according to claim 1 or 2, wherein the search line drivers are coupled to the first wiring portion.

4. A content addressable memory which performs a comparison between search data inputted from outside and data stored in advance, comprising:
   first and second blocks each including:
      a plurality of match lines disposed so as to extend in a first direction;
      a plurality of search lines disposed so as to extend in a second direction intersecting with the first direction;
      a memory cell array having a plurality of memory cells respectively disposed at points where the match lines and the search lines intersect;
      a plurality of search line drivers which are disposed every corresponding search line and drive the search lines according to the search data; and
      a search control circuit which transmits the search data to the search line drivers through a control signal wiring extending in the first direction,
   wherein the first and second blocks are disposed side by side in the first direction,
   wherein the search control circuit of the first block is disposed at one end in the first direction, of the entire first and second blocks,
   wherein the search control circuit of the second block is disposed at the other end in the first direction, of the entire first and second blocks,
   wherein the control signal wiring has:
      a first wiring portion which extends in the first direction and has both ends respectively coupled to the search control circuit of the first block and the search control circuit of the second block;
      a second wiring portion disposed between the first and second blocks;
      a third wiring portion which extends in the first direction and has both ends respectively coupled to the search control circuit of the first block and the second wiring portion; and
      a fourth wiring portion which extends in the first direction and has both ends respectively coupled to the search control circuit of the second block and the second wiring portion.

5. The content addressable memory according to claim 4, wherein the search line drivers of the first block are respectively coupled to the first wiring portion, and wherein the search line drivers of the second block are respectively coupled to the fourth wiring portion.

6. The content addressable memory according to claim 4 or 5, wherein the first, third and fourth wiring portions are disposed in a first wiring layer, and wherein the second wiring portion is disposed in a second wiring layer different from the first wiring layer.

7. A content addressable memory which performs a comparison between search data inputted from outside and data stored in advance, comprising:

first and second blocks each including:
a plurality of match lines disposed so as to extend in a first direction;
a plurality of search lines disposed so as to extend in a second direction intersecting with the first direction;
a memory cell array having a plurality of memory cells respectively disposed at points where the match lines and the search lines intersect;
a plurality of search line drivers which are disposed every corresponding search line and drive the search lines according to the search data; and
a search control circuit which transmits the search data to the search line drivers through a control signal wiring extending in the first direction, wherein the first and second blocks are disposed side by side in the first direction, wherein the search control circuit of the first block is disposed at one end in the first direction, of the entire first and second blocks, wherein the search control circuit of the second block is disposed at the other end in the first direction, of the entire first and second blocks, wherein the control signal wiring has:
first and second wiring portions which extend in the first direction and have one ends thereof each coupled to the search control circuit of the first block; and
third and fourth wiring portions which extend in the first direction and have one ends thereof each coupled to the search control circuit of the second block, wherein the first and third wiring portions are disposed in a first wiring layer, wherein the second and fourth wiring portions are disposed in a second wiring layer different from the first wiring layer, wherein the other ends of the first and fourth wiring portions are coupled to each other through a contact, and wherein the other ends of the second and third wiring portions are coupled to each other through a contact.

8. The content addressable memory according to claim 7, wherein the search line drivers of the first block are respectively coupled to the first wiring portion, and wherein the search line drivers of the second block are respectively coupled to the third wiring portion.

* * * * *